United States Patent [19]

Suzuki et al.

[11] Patent Number: 5,331,731
[45] Date of Patent: Jul. 26, 1994

[54] CYCLOID MOTION WORK MOUNTING APPARATUS

[75] Inventors: Hisao Suzuki; Kazuhiro Tokitu; Tadashi Munakata; Yoshinobu Ishikawa, all of Tokyo; Takatomo Izume, Saitama; Masamichi Kato; Etuo Minamihama, both of Mie, all of Japan

[73] Assignees: Japan Tobacco Inc., Tokyo; Kabushiki Kaisha Toshiba, Kawasaki, both of Japan

[21] Appl. No.: 950,883

[22] Filed: Sep. 25, 1992

[30] Foreign Application Priority Data

Sep. 26, 1991 [JP] Japan .................................. 3-248062
Sep. 26, 1991 [JP] Japan .................................. 3-248064
Sep. 26, 1991 [JP] Japan .................................. 3-248065

[51] Int. Cl.⁵ .......................... B23P 19/04; B65H 5/18
[52] U.S. Cl. .......................................... 29/759; 29/740; 29/743; 29/DIG. 44; 198/475.1; 414/223
[58] Field of Search ............... 29/721, 739, 740, 741, 29/742, 743, 759, 760, 822, DIG. 44; 198/377, 471.1, 475.1, 476.1; 414/223, 225, 737, 744.2; 901/40

[56] References Cited

U.S. PATENT DOCUMENTS 4,372,802  2/1983  Harigane et al. ................... 29/740
4,706,379 11/1987  Seno et al.
5,033,185  7/1991  Hidese ........................... 29/743 X
5,234,304  8/1993  Okumoto et al. ................. 29/741 X

FOREIGN PATENT DOCUMENTS 205500  8/1989  Japan ............................... 29/743
3203399 9/1991  Japan ............................... 29/743

Primary Examiner—Peter Dungba Vo
Attorney, Agent, or Firm—Oblon, Spivak, McClelland, Maier & Neustadt

[57] ABSTRACT

A work mounting apparatus according to the present invention comprises a rotating drum divided into upper and lower drums, a head unit arranged on the outer periphery of the rotating drum or the lower drum, a circular work head attached to the head unit, and a suction nozzle protruding from the outer peripheral surface of the work head toward a workbench. While the lower drum is rotating, the suction nozzle of the work head repeats cycloid motion along the workbench with its posture or orientation kept fixed with respect to the workbench. While repeating the cycloid motion, the nozzle receives a work from a work feeder of the workbench by suction, and mounts the work on a printed board on the workbench. The work mounting apparatus further includes a balance weight for the work head, and a friction brake for applying a frictional force to the turning shaft of the work head, to thereby stabilize the turning motion of the work head.

10 Claims, 17 Drawing Sheets

CYCLOID MOTION WORK MOUNTING APPARATUS

BACKGROUND OF THE INVENTION

1. Field of the Invention

The present invention relates to a work mounting apparatus for mounting an IC chip or some other electronic component, as a work, on a printed board.

2. Description of the Related Art

A work mounting apparatus of this type is disclosed in Published Unexamined Japanese Patent Application No. 62-114290, for example. This conventional apparatus comprises a rotating table and a plurality of suction heads arranged at predetermined intervals on the outer peripheral edge of the table. Each suction head is capable of up-and-down motion.

A workbench is disposed under the rotating table, and a work supply section and a work mounting section are arranged on the workbench at a distance from each other in the circumferential direction of the table. A plurality of work feeders are radially arranged in the supply section, while a printed board is disposed in the mounting section.

When one of the suction heads is positioned in one of the work feeders of the supply section as the table rotates, the rotation of the table is stopped. In this state, the suction head is lowered, receives a work from the work feeder by suction, and is then raised to its original position. When the rotation of the table is restarted, thereafter, the suction head is transferred from the supply section to the mounting section. When the suction head is positioned in the mounting section, the rotation of the table is stopped again. In this state, the suction head is lowered again, whereupon the work is released from the suction, so that it is mounted on the printed board in the mounting section.

According to the work mounting apparatus described above, the rotation of the table must be stopped every time the suction head is move up or down, that is, every time the work is received or mounted in the supply or mounting section. In other words, the rotation of the table and the operation of the suction head are performed intermittently, so that the tact time cannot be shortened, and therefore, the work mounting efficiency is low.

In these circumstances, there is a demand for continuous-type work mounting apparatuses in which works can be received and mounted without stopping the rotation of the table.

In one such continuous-type mounting apparatus, for example, a continuously rotatable drum, which is used in place of the rotating table, is surrounded by a plurality of work heads which repeat up-and-down motion as they turn. More specifically, the work heads turn around a turning axis which extends in the radial direction of the rotating drum, and their respective postures are kept fixed during the turning motion.

Thus, if a suction nozzle is provided protruding downward from each work head, it can repeat up-and-down motion while moving in the circumferential direction of the rotating drum, as the drum rotates and as the work head turns.

If the turning speed and turning direction of the work head are properly set with respect to the peripheral speed of the rotating drum, moreover, the relative speed of the suction nozzle with respect to the supply and mounting sections, that is, the ground speed, can be reduced substantially to zero when the suction nozzle lowers so that the supply and mounting sections come closest to each other. Even while the rotating drum is being continuously rotated, therefore, the suction nozzle of the work head can securely receive a work from one of the work feeders of the supply section by suction, and then mount the received work head on a printed board in the mounting section.

In the above continuous-type work mounting apparatus, however, if the up-and-down motion of the suction nozzle in association with the rotation of the drum, i.e., the cycloid motion of the work head, is unstable, the work cannot be accurately mounted in the target mounting position on the printed board, or even the mounting of the work in the mounting position cannot be carried out.

On the other hand, to permit the works to be taken out from different work feeders, the cycle of the cycloid motion need by variable.

Thus, the cycloid motion of the work head must be controlled with high accuracy, and to this end, stable turning of the work head is essential.

The work head, however, has a relatively large mass, and the turning speed thereof is liable to change during one turning motion.

Further, the turning shaft of the work head is usually connected to the drive source by means of gear train, and therefore, backlash of the meshed gears is unavoidable. If the backlash is large, undesirable variation in the rotation of the turning shaft occurs, which is a major cause of instability of the turning speed of the work head.

A belt-type planetary mechanism, for example, may be employed to keep the posture of the work head fixed during the turn of the work head. More specifically, such a planetary mechanism may comprise a toothed pulley provided at the outer periphery of the turning shaft, a toothed pulley arranged coaxially with the axis of the work head, and a toothed belt passed around and between these pulleys. If the planetary mechanism of this type is used, the rotation of the work head is restrained by the toothed belt during the turn of the work head, and consequently, the posture of the work head can be kept fixed.

The work mounting apparatus is further provided with correction means for correcting the posture of the work after the work is attracted to the suction nozzle, and this correction means is indispensable in order to accurately mount the work on the printed board.

In the case of the above planetary mechanism, however, it is difficult to continually maintain the same state of engagement of the toothed belt with the paired pulleys during the turn of the work head. Namely, the teeth of the pulleys and belts are subject to pitch error when they are manufactured. Thus, a slight variation occurs in the posture of the work head during the turning motion, adversely affecting the correction of the work posture by the correction means.

SUMMARY OF THE INVENTION

The object of the present invention is to provide a work mounting apparatus capable of stabilizing the turning motion of a work head to thereby accurately carry out the mounting of works.

The above object is achieved by a work mounting apparatus according to the present invention, which comprises: a work supply section disposed in a predetermined transportation path and having a supply position being successively supplied with works; a work mounting section disposed at a distance from the supply section, in the transportation path, and having a work mounting surface movable across the transportation path; a carrier repeatedly movable along the transportation path between the mounting section and the supply section; a work head provided on the carrier, the work head having a turning axis extending across the transportation path and including an attraction rod projecting from the work head toward the transportation path; turning means for turning the work head around the turning axis while keeping the work head in a fixed posture or orientation with respect to the transportation path, during the movement of the carrier, and subjecting the distal end of the attraction rod to cycloid motion along the transportation path; attraction means for supplying an attraction force to the rod; control means for controlling the operation of the turning means and the attraction means, the control means causing one of the works to be attracted to the distal end of the rod in the supply position, and then releasing the work from the hold by the rod at the mounting surface, so that the work is mounted on the mounting surface; and stabilizing means for stabilizing the turning motion of the work head.

The work mounting apparatus is provided with the stabilizing means, whereby the turning motion of the work head, i.e., the cycloid motion of the attraction rod, is stabilized and the attraction and mounting of the works can be accurately carried out.

More specifically, the stabilizing means includes a balance weight which is turned together with the work head. The balance weight serves not only to stabilize the turning motion of the work head but also to facilitate the control of the turning speed of the work head.

The stabilizing means further includes a friction brake for continually applying a constant frictional force to the turning shaft of the work head. Accordingly, even if the turning shaft is connected to the drive source via a gear train, the engagement of the gear of the turning shaft with the gear of the drive-source side can be stabilized due to the frictional force applied to the turning shaft by the friction brake. As a result, no deviation occurs in the rotational angle of the turning shaft and the turning motion of the work head is stabilized.

Furthermore, the stabilizing means is installed in the turning means. Namely, the turning means includes the aforementioned planetary mechanism for keeping the posture of the work head fixed during the turn of the work head, and the stabilizing means constitutes part of the planetary mechanism. The stabilizing means permits the same state of engagement of the toothed belt with the paired pulleys in the planetary mechanism to be reproduced every time the work head makes an integral number of turns.

Thus, if the state of engagement established when the posture or orientation of the work is detected is made identical with that established when the work is mounted on the mounting surface, the posture correction for the attracted work by correction means is never adversely affected, and the correction can be executed appropriately.

The above and other objects, features, and advantages of the invention will be more apparent from the ensuing detailed description taken in connection with the accompanying drawings. It is to be expressly understood, however, that the drawings are for purpose of illustration only and are not intended as a definition of the limits of the invention.

DETAILED DESCRIPTION OF THE PREFERRED EMBODIMENTS

Figure 1:
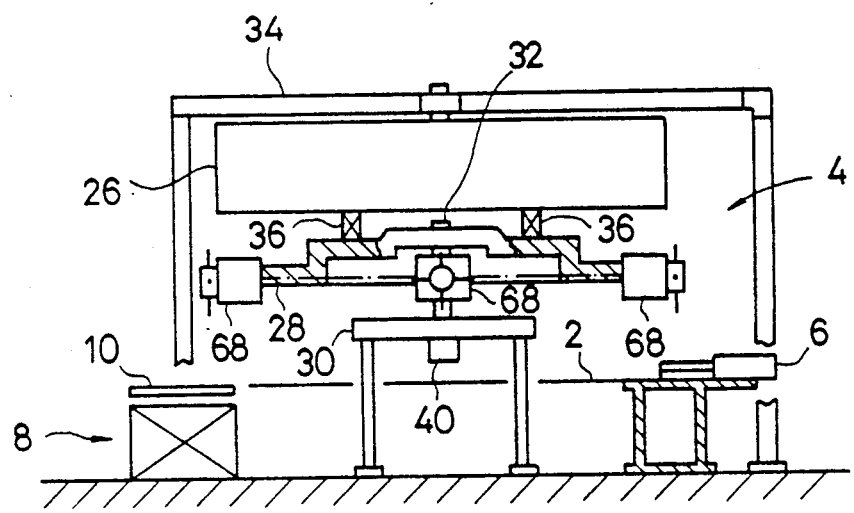
FIG. 1 is a schematic side view, partially in section, showing a chip mounter according to one embodiment of the present invention.
Figure 2:
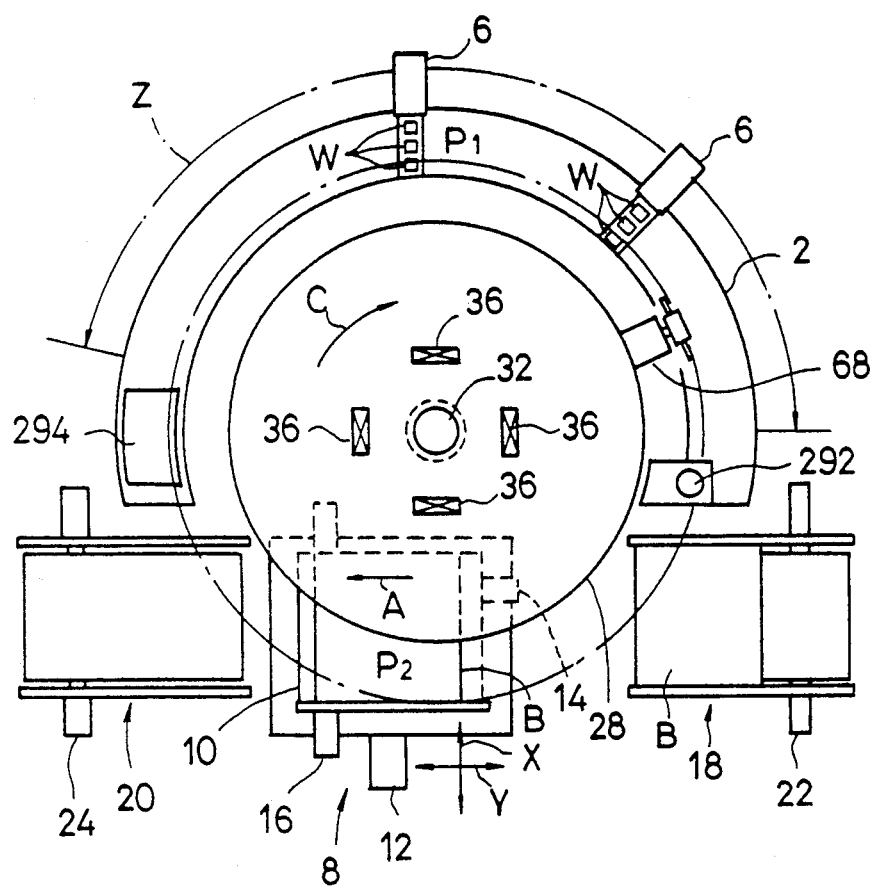
FIG. 2 is a schematic plan view showing the chip mounter of FIG. 1 with its upper drum omitted.

Referring now to FIGS. 1 and 2, there is shown an outline of a chip mounter. The chip mounter generally comprises a ring-shaped workbench 2 and a rotating drum 4 arranged over the workbench 2. The drum 4 is rotatable within a horizontal plane.

A large number of work feeders 6 are mounted in a radial shape on the workbench 2. These work feeders 6 can continuously feed various electronic components or works, such as IC chips, resistors, capacitors, etc., into a predetermined position on the workbench 2.

The work feeders 6 are arranged at regular intervals in the circumferential direction of the workbench 2, each feeder 6 constituting a work supply section. FIG.

2 shows only two of the work feeders 6 or supply sections.

As seen from FIG. 2, the workbench 2 is partially cut, and a mounting section is disposed in the cut region. The mounting section includes an XY-table 8, which has a table face 10. The table face 10 can be moved in the X-direction of FIG. 2 by means of an electric motor 12, and in the Y-direction by means of another electric motor 14. The Y-direction is perpendicular to the X-direction.

The table face 10 is defined by an endless belt, which is run in the A-direction of FIG. 2 by means of an electric motor 16. The A-direction is coincident with the Y-direction.

Conveyors 18 and 20 are arranged close to each other on the opposite sides of the table face 10, individually, with respect to the A-direction. Each of these conveyors 18 and 20, like the table face 10, includes an endless belt.

The table face 10 and the conveyors extend in alignment with one another, and the conveyors 18 and 20 can be run in the A-direction by means of electric motors 22 and 24, respectively.

A printed board B is fed onto the one conveyor 18. In FIG. 2, the printed board B is kept on standby on the conveyor 18. If the table face 10 is moved in the Y-direction toward the conveyor 18, it is connected to the conveyor 18. When the conveyor 18 and the belt of the table face 10, in this state, are run together in the A-direction, the printed board B on the conveyor 18 is allowed to be transferred to the table face 10.

If the table face 10 is moved in the Y-direction toward the conveyor 20, on the other hand, it is connected to the conveyor 20. When the table face 10 and the belt of the conveyor 20 are run together in the A-direction, in this case, the printed board B on the table face 10 is discharged onto the conveyor 20.

Thus, the one conveyor 18 has a function to carry in the printed board B onto the table face 10, while the other conveyor 20 has a function to carry out the printed board B from the table face 10.

A work supply position on the workbench 2, which is defined by each work feeder 6, and the printed board B on the table face 10 are on the same level. In FIG. 2, symbol Z designates a region in which the work feeders 6 can be set.

As shown in FIG. 1, the rotating drum 4 comprises an upper drum 26 and a lower drum 28 which are divided in the vertical direction. The lower drum 28 is rotatably supported on a drum base 30 by means of a drum shaft 32. The drum base 30 is located in the center of the workbench 2. The upper drum 26 is rotatably suspended from a frame 34, which surrounds the whole chip mounter. The upper and lower drums 26 and 28 are connected to each other by means of a plurality of couplers 36.

Figure 3:
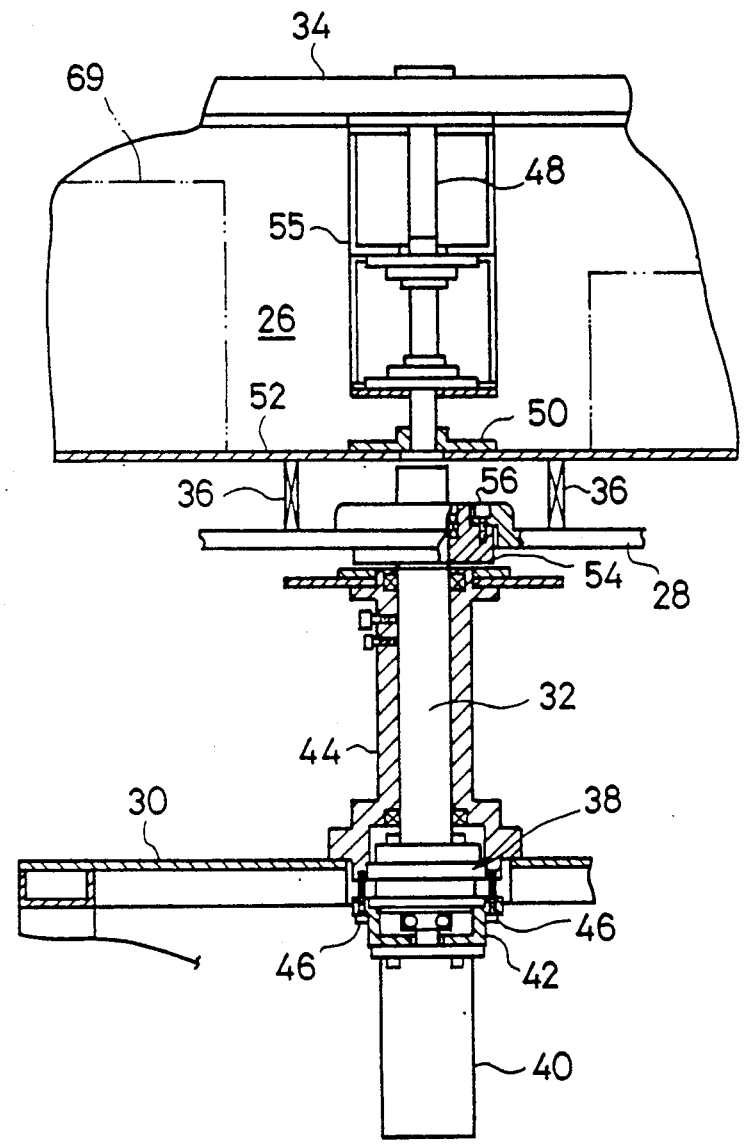
FIG. 3 is a sectional view showing a supporting structure for a rotating drum of the chip mounter.

FIG. 3 shows a supporting structure for the drum shaft 32 on the drum base 30, a supporting structure for the upper drum 26 on the frame 34, and a connecting structure for the lower drum 28 on the drum shaft 32.

The drum shaft 32 extends vertically through the center of the drum base 30, and a drive motor 40 is connected to the lower end of the shaft 32 by means of a speed reducer 38. The motor 40 and the reducer 38 are attached to the lower end of a fixed sleeve 44 by means of a holder 42 and a plurality of connecting bolts 46. The sleeve 44, which surrounds the drum shaft 32, has its lower end fixed to the drum base 30.

The upper drum 26, which is a hollow structure, is rotatably suspended from the frame 34 by means of a supporting shaft 48. More specifically, the upper end of the shaft 48 is rotatably supported on the frame 34, and a bottom plate 52 of the upper drum 26 is connected to the lower end of the shaft 48 by means of a flange 50. Further, a bearing unit 55 is mounted on the frame 34 so as to surround the supporting shaft 48.

The supporting shaft 48 of the upper drum 26 and the drum shaft 32 are situated on the same axis. A gap of a predetermined size is defined between the bottom plate 52 of the upper drum 26 and the upper end of the drum shaft 32.

The lower drum 28 has a boss 54 in the center, which is connected to the drum shaft 32 by means of a plurality of connecting bolts 56.

As seen from FIG. 2, the four couplers 36, which connect the lower and upper drums 28 and 26, are arranged at regular intervals on the circumference of the same circle. Since these couplers 36 have the same construction, one of them will be described in detail with reference to the drawing of FIG. 4.

The coupler 36 comprises a lower connecting bracket 57 protruding from the upper surface of the lower drum 28 and a pair of upper connecting brackets 58 suspended from the upper drum 26. The upper brackets 58 are situated individually on the opposite sides of the lower bracket 57 with respect to the circumferential direction of the lower drum 28. The lower bracket 57 and the paired upper brackets 58 are connected to one another by means of two leaf springs 60 which are joined together. The springs 60 are fixed to the lower connecting bracket 57 at the center by means of a connecting bolt-nut assembly 62. The respective opposite ends of the leaf springs 60 are fixed to their corresponding upper connecting brackets 58 by means of connecting bolt-nut assemblies 64, individually.

Figure 4:
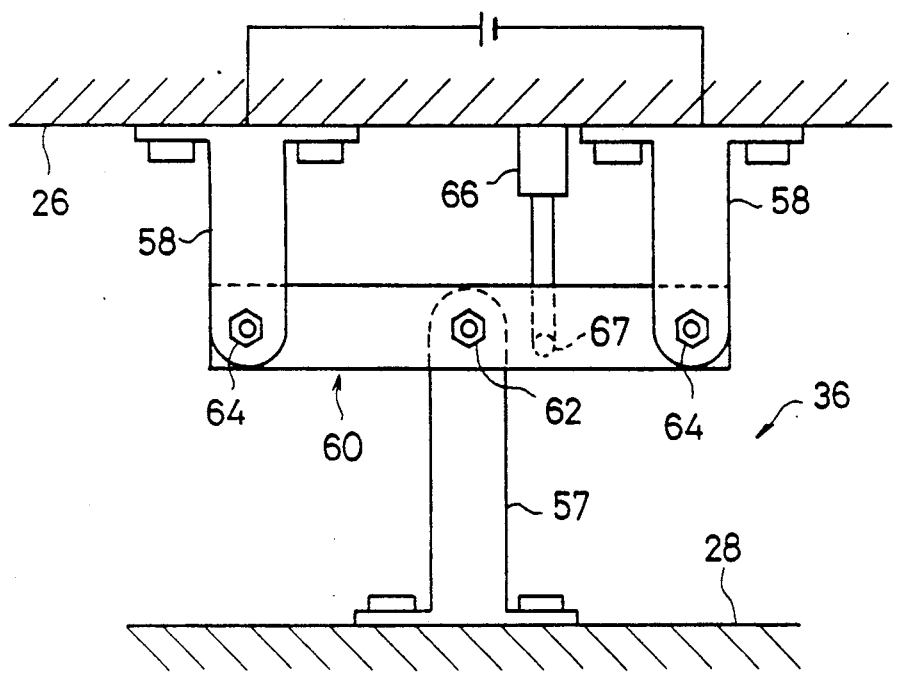
FIG. 4 is an enlarged view showing a coupler for connecting lower and upper drums.

Further, the coupler 36 comprises a sensor 66 for detecting the occurrence of breakage of the leaf springs 60. As shown in FIG. 4, the sensor 66 of this type is mounted on the lower surface of the upper drum 26, and has a contact 67 which touches the springs 60. Thus, when voltage is applied between the paired upper connecting brackets 58, the sensor 66 can detect electric current flowing through the leaf spring 60, and output a detection signal indicative of this current. The detection signal from the sensor 66 is supplied to a controller 69 (see FIG. 3) which is disposed in the upper drum 26. In response to the detection signal from the sensor 66, the controller 69 can detect the occurrence of breakage of the leaf springs 60.

Figure 5:
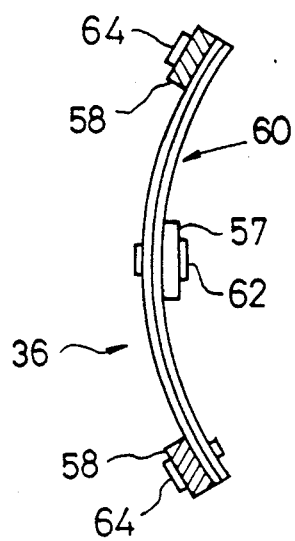
FIG. 5 is a sectional view showing a modification of the coupler.

The coupler 36 is not limited to the one shown in FIG. 4, and a coupler 36 shown in FIG. 5 may be used in place of the coupler of FIG. 4. The coupler 36 of FIG. 5 differs from the coupler of FIG. 4 only in that its leaf springs 60 are previously curved in the shape of a circular arc along the circumferential direction of the lower drum 28.

When the drive motor 40 is driven, the lower drum 28 is rotated in the direction of arrow C of FIG. 1 through the medium of the drum shaft 32. The rotatory force of the lower drum 28 is transmitted to the upper drum 26 through the couplers 36, so that the upper drum 26 is rotated integrally with the lower drum 28.

The lower drum 28 is provided with a large number of head units 68 which are used to take out works in the respective supply positions of the work feeders 6, and then mount them on the printed board B. These head units 68 are arranged at regular intervals in the circumferential direction of the lower drum 28.

The head units 68, which are shown only schematically in FIGS. 1 and 2, have the same construction and are situated in the same radial position with respect to the lower drum 28. The following is a description, therefore, of only one of the units 68.

Figure 6:
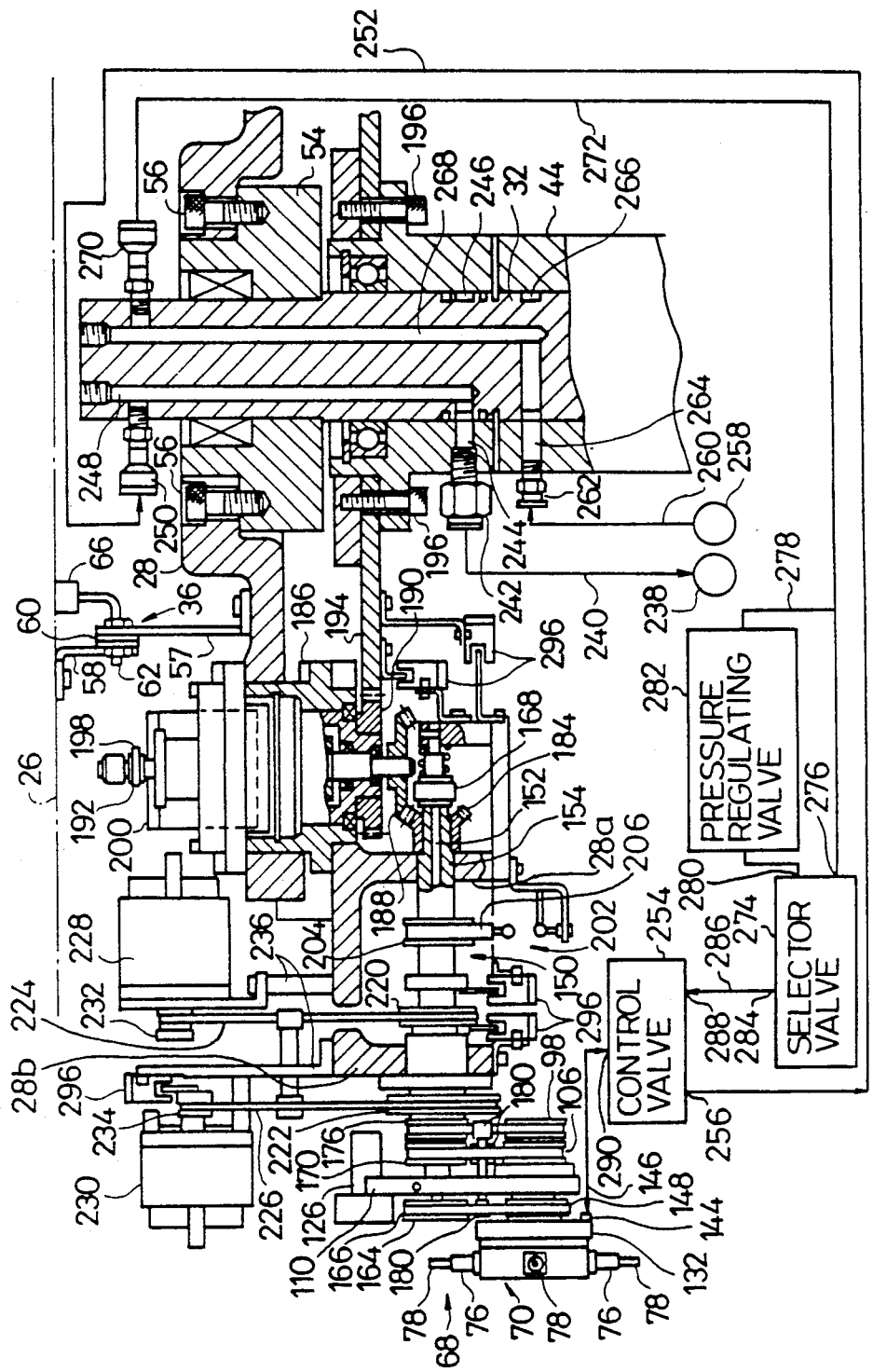
FIG. 6 is a sectional view showing a drive system in a lower drum, ranging from a drum shaft to a head unit.
Figure 7:
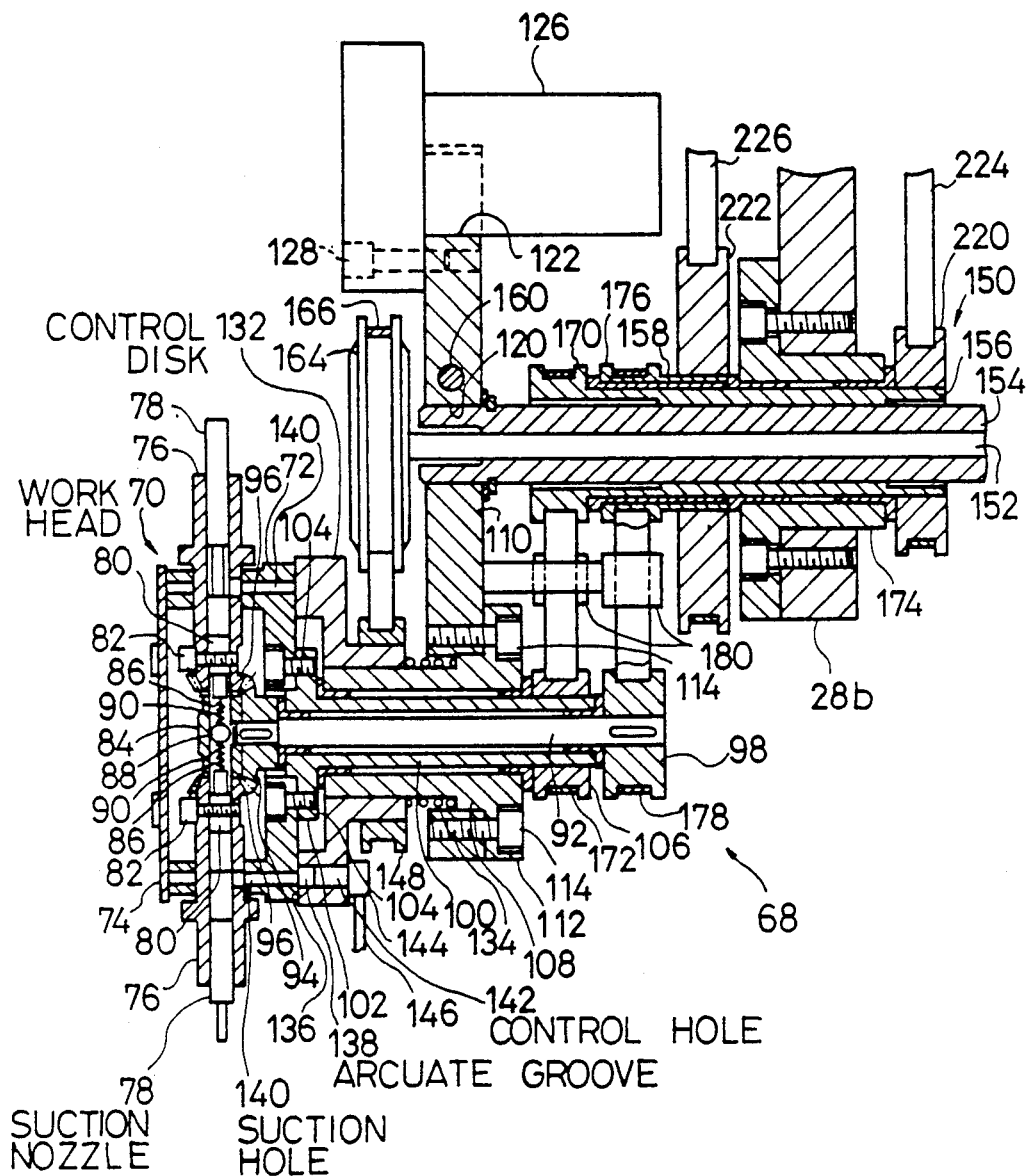
FIG. 7 is a sectional view showing the head unit in detail.

FIGS. 6 and 7 individually show in detail a specific arrangement of the head unit 68 and a drive system for the unit 68. Referring first to FIG. 7, the construction of the head unit 68 will be described.

The head unit 68 comprises a work head 70, which is positioned protruding from the outer peripheral edge of the lower drum 28. The head 70 includes a cylindrical head housing 72, whose axis extends in the radial direction of the lower drum 28. Thus, the head housing 72 has two opposite end faces which cross the radial direction of the lower drum 28 at right angles. The outer one of these end faces is open. This open end face is closed by means of a cover 74.

Four pipe-shaped nozzle holders 76 are provided on the peripheral wall of the head housing 72. These holders 76, which are arranged at regular intervals in the circumferential direction of the head housing 72, are attached to the housing 72 so as to penetrate the peripheral wall thereof. Further, the nozzle holders 76 are supported on the head housing 72 for rotation around their respective axes. Thus, the holders 76 protrude radially from the peripheral wall of the head housing 72.

A suction nozzle 78 is attached to each nozzle holder 76 so as to penetrate it. More specifically, an axial flattened portion 80 is formed in that part of the suction nozzle 78 which is situated in the nozzle holder 76, and a stopper bolt 82 is screwed into the holder 76 through the flattened portion 80 of the nozzle 78. Thus, the suction nozzle 78 can be rotated integrally with the nozzle holder 76 around its axis by means of the bolt 82. With respect to its axial direction, however, the nozzle 78 can move relatively to the holder 78 only for a distance corresponding to the length of the flattened portion 80.

The outer end of each suction nozzle 78 projects outward from the nozzle holder 76, and is provided with a suction port (not shown). The respective suction ports of the nozzles 78 are different in size from one another, depending on the sizes of the works to be attracted thereto.

A disk-shaped guide holder 84 is disposed in the central portion of the head housing 72. Guide holes 86 are formed radially in the peripheral surface of the guide holder 84, corresponding individually to the suction nozzles 78. Thus, the respective inner ends of the nozzles 78 projecting from the nozzle holders 76 are slidably fitted in their corresponding guide holes 86 of the guide holder 84. Further, the guide holder contains a ball 88, which is situated in the region where the guide holes 86 get together, and closes the respective inner ends of the holes 86. In each guide hole 86, a coil spring 90 is interposed between the inner end of the suction nozzle 78 and the ball 88. The spring 90 continually urges its corresponding nozzle 78 to the outside with respect to the radial direction of the work head 70, that is, in the direction to project from the head 70.

A first spindle 92 extends from the head housing 72 toward the lower drum 28. The axis of the spindle 92 is coaxial with the housing 72. One end of the spindle 92, which is situated in the head housing 72, supports the guide holder 84. A side gear 94, formed of a bevel gear, is mounted on one end portion of the first spindle 92 by means of a key. The diameter of the gear 94 is greater than that of the guide holder 84. Each nozzle holder 76 has a pinion 96, in the form of a bevel gear, on its inner end. The pinions 96 are in mesh with the side gear 94.

Meanwhile, a toothed pulley or nozzle driving pulley 98 is mounted on the other end of the first spindle 92. When an external rotatory force is transmitted to the pulley 98, it is transmitted from the pulley 98 to the side gear 94 through the spindle 92. Then, the rotatory force is transmitted from the gear 94 to the individual nozzle holders 76 through the pinions 96. Thus, the holders 76 and their corresponding suction nozzles 78 are rotated around their respective axes.

A hollow second spindle 100 is coaxially fitted on the first spindle 92. Both ends of the second spindle 100 are rotatably supported on the first spindle 92 by means of a pair of bearings, individually. The second spindle 100 extends from the head housing 72 to the nozzle driving pulley 98. A flange 102 is formed on one end of the second spindle 100 which is situated on the side of the housing 72. The flange 102 is connected to the housing 72 by means of a plurality of connecting bolts 104. Thus, the head housing 72 can rotate together with the second spindle 100. A head driving pulley 106 formed of a toothed pulley is mounted on the other end of the second spindle 100. The pulley 106 is situated adjacent to the nozzle driving pulley 98. When an external rotatory force is transmitted to the pulley 106, the pulley 106 causes the head housing 72 to rotate through the medium of the second spindle 100. Thus, the second spindle 100 serves as the axis of rotation of the housing 72 or the work head 70.

Further, a hollow third spindle 108 is coaxially fitted on the second spindle 100. Both ends of the third spindle 108 are rotatably supported on the second spindle 100 by means of a pair of bearings, individually. The third spindle 108 extends from the flange 102 of the second spindle 100 to the head driving pulley 106.

A link arm 110, which extends from the third spindle 108, is connected integrally to the spindle 108. More specifically, a flange 112 is formed on that end portion of the third spindle 108 which is situated on the side of the head driving pulley 106. The flange 112 is connected to the link arm 110 by means of a plurality of connecting bolts 114.

Figure 8:
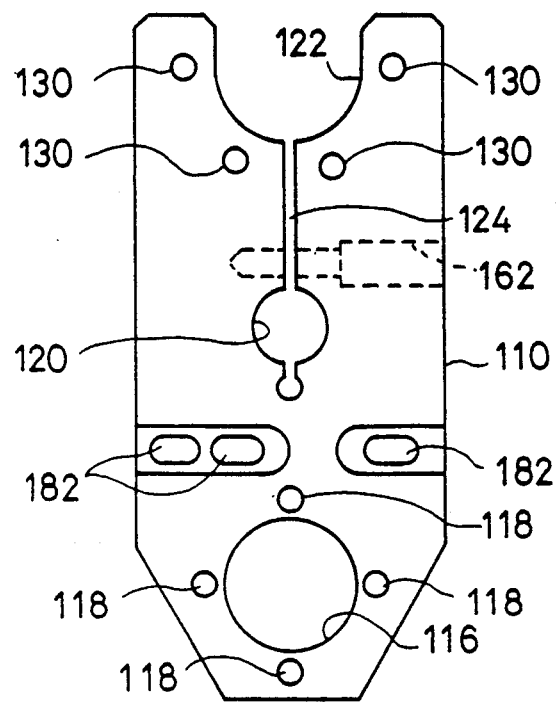
FIG. 8 is a front view showing a link arm of the head unit.

The link arm 110 is formed of a plate member, such as the one shown in FIG. 8. A fitting hole 116 for the third spindle 108 is formed at one end portion of the plate member, and tapped holes 118 for the connecting bolts 114 are formed around the hole 116.

Further, a center hole 120 is formed in the link arm 110, and a semicircular recess 122 is formed at the other end of the arm 110. The recess 122 and the center hole 120 are connected by means of a slit 124, and a notch groove in line with the slit 124 is formed on the inner peripheral surface of the hole 120.

As shown in FIG. 7, a balance weight 126 is fitted in the recess 122 of the link arm 110. The weight 126 is fixed to the arm 110 by means of a plurality of connecting bolts 128. As shown in FIG. 8, therefore, tapped holes 130 for the bolts 128 are formed in the link arm 110 so as to surround the recess 122.

The balance weight 126 is substantially as heavy as the head unit 68 which is connected to the one end of the link arm 110. Thus, the weights of the opposite sides of the link arm 110 are in equilibrium with the hole 120 as the center.

A control disk 132 is rotatably mounted on the third spindle 108. The disk 132 has a stepped configuration, and its large-diameter portion is in engagement with the head housing 72. A hole is formed in the center of the end face of the large-diameter portion of the disk 132. This hole has a diameter greater than that of the flange 102 of the second spindle 100. Thus, the end face or ring-shaped end face 136 of the large-diameter portion of the control disk 132 can engage the head housing 72 without being hindered by the flange 102 of the second spindle 100.

A coil spring 134 is disposed between a small-diameter portion of the control disk 132 and a step on the third spindle 108 so as to surround the spindle 108. The spring 134 presses the ring-shaped end face 136 of the disk 132 against the head housing 72. Thus, the end face 136 and the end face of the housing 72 are airtightly in sliding contact with each other.

Figure 9:
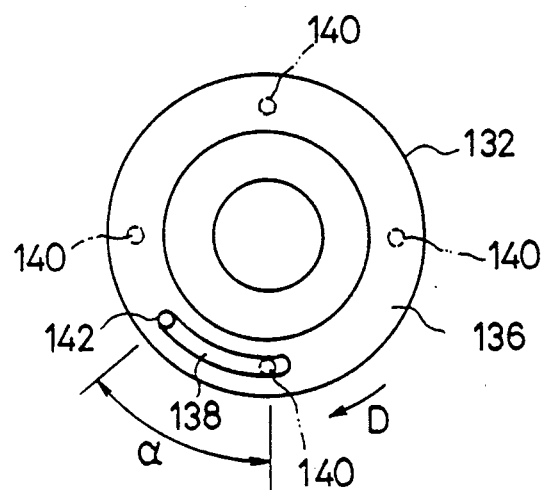
FIG. 9 is an end view showing a control disk of the head unit.

As shown in FIG. 9, an arcuate groove 138 is formed in the sliding-contact surface 136 of the control disk 132. As shown in FIG. 7, on the other hand, suction holes 140 open in the end face of the head housing 72. The respective openings of the holes 140 are arranged at regular intervals in the circumferential direction of the housing 72. Each suction hole, which is not shown in detail, continually communicates with its corresponding suction nozzle 78 by means of the nozzle holder 76.

In the state shown in FIG. 9, one of the suction holes 140 of the head housing 72 is connected to the arcuate groove 138 of the control disk 132, and is then situated at one end of the groove 138. As seen from FIG. 7, the distal end of the suction nozzle 78 associated with the connected suction hole 140 faces downward.

Even when the head housing 72 or the work head 70 is rotated for a predetermined rotational angle α (e.g., 45°) in the direction of arrow D of FIG. 9, the connection between the arcuate groove 138 and the suction hole 140 can be maintained. Therefore, the groove 138 has a length equivalent to the rotational angle α of the work head 70.

A control hole 142 is formed in the control disk 132. One end of the hole 142 is connected to the arcuate groove 138, and the other end thereof opens in that end face of the disk 132 on the opposite side to the sliding-contact surface 136. The opening of the control hole 142 is connected to a flexible tube 146 by means of a connecting plug 144. The tube 146 is connected to a suction circuit, which will be mentioned later. Thus, when a suction pressure from this suction circuit is supplied to the suction nozzle 78 through the tube 146, control hole 142, arcuate groove 138, and suction hole 140, the nozzle 78 is enabled to attract a work to its suction port.

A disk pulley 148 formed of a toothed pulley is mounted on the small-diameter portion of the control disk 132.

The head unit 68 is removably connected to the drive system on the side of the lower drum 28.

The drive system of the lower drum 28 comprises a shaft assembly 150, which extends in the radial direction of the drum 28. Part of the assembly 150 includes a quadruple-shaft portion, which is positioned projecting from the outer peripheral portion of the lower drum 28. Thus, the quadruple-shaft portion is situated in the vicinity of the head unit 68.

The quadruple-shaft portion includes a fixed shaft 152 on the center side and first, second, and third sleeve shafts 154, 156 and 158 rotatably fitted on the shaft 152 in succession.

One end portion of the first sleeve shaft 154 projects outward from the second and third sleeve shafts 156 and 158 with respect to the radial direction of the lower drum 28. The link arm 110 of the head unit 68 is removably connected to this projecting end portion of the first sleeve shaft 154. More specifically, the one end portion of the first sleeve shaft 154 is fitted in the center hole 120 of the arm 110. A tapped hole 162 (see FIG. 8), which extends across the slit 124, is formed in a side face of the arm 110. A connecting screw 160 is screwed in the hole 162. As the screw 160 is thus screwed in, the slit 124 of the arm 110 is narrowed so that the center hole 120 is reduced in diameter. As a result, the connection between the link arm 110 and the first sleeve shaft 154 is established.

As seen from FIG. 6, the other end side of the first sleeve shaft 154 extends inward from the quadruple-shaft portion with respect to the radial direction of the lower drum 28, and penetrates an inside drum wall 28a which protrudes from the lower surface of the drum 28. Thus, the other end portion of the shaft 154 is rotatably supported by the wall 28a.

Besides the inside drum wall 28a, an outside drum wall 28b is formed on the lower surface of the lower drum 28 so as to surround the wall 28a.

Further, both ends of the fixed shaft 152 extend penetrating the first sleeve shaft 154. More specifically, one end portion of the shaft 152 projects from the link arm 110, as shown in FIG. 7. A fixed pulley 164 formed of a toothed pulley is mounted on the one end of the fixed shaft 152 by means of a mounting bolt (not shown). A toothed belt 166 is passed around and between the pulley 164 and the disk pulley 148.

As shown in FIG. 6, on the other hand, the other end of the fixed shaft 152 projects from the first sleeve shaft 154, and is supported by the lower drum 28. A thrust bearing 168 for receiving a thrust force from the first sleeve shaft 154 is mounted on the other end portion of the fixed shaft 152.

As shown in FIG. 7, the second sleeve shaft 156 has one end situated in the vicinity of the link arm 110, and extends inward for a predetermined length, with respect to the radial direction of the lower drum 28. An output pulley 170 formed of a toothed pulley is provided on the one end of the second sleeve shaft 156. A toothed belt 172 is passed around and between the output pulley 170 and the head driving pulley 106. The other end portion of the second sleeve shaft 156 penetrates a bearing unit 174, and is rotatably supported by the unit 174. The bearing unit 174 is fixed to the outside drum wall 28b of the lower drum 28.

Further, the third sleeve shaft 158 extends between the output pulley 170 of the second sleeve shaft 156 and the bearing unit 174. An output pulley 176 formed of a toothed pulley is mounted on one end of the third sleeve shaft 158. A toothed belt 178 is passed around and between the output pulley 176 and the nozzle driving pulley 98.

A predetermined tension is applied to each of the three toothed belts 166, 172 and 178 by means of a plurality of tension rollers 180 shown in FIGS. 6 and 7. The tension rollers 180 are rotatably mounted on roller shafts which extend from the link arm 110. As shown in FIG. 8, therefore, mounting holes 182 for the roller shafts are formed in the arm 110.

The pulley ratio between each pulley of the shaft assembly 150 and its corresponding pulley of the head unit 68 is set at 1:1. Thus, even if the first sleeve shaft 154 is rotated by means of an external driving force when the respective output pulleys 170 and 176 on the second and third sleeve shafts 156 and 158, as well as the pulley 164 on the fixed shaft 152, are stopped from rotating, the head unit 68 rotates around the first sleeve shaft 154. At this time, the work head 70 is caused to turn around the first sleeve shaft 154 by the link arm 110, that is, the shaft 154 serves as a pivot of the head 70.

When the work head 70 turns in this manner, the toothed belts 166, 172 and 178, which are passed around and between the pulleys 148, 106, and 98 and their corresponding pulleys on the side of the shaft assembly 150, are restrained from rotating. In this case, therefore, the work head 70 keeps its posture or orientation fixed as it turns around the first sleeve shaft 154. Thus, the pulleys of the shaft assembly 150, pulleys of the head unit 68, and toothed belts constitute a planetary mechanism, which causes the work head 70 to turn while maintaining the posture of each suction nozzle 78 of the head 70. Accordingly, when one of the nozzles 78 of the head 70 faces downward, its downward posture can be maintained despite the turn of the work head 70.

Since the control disk 132 turns together with the work head 70 around the first sleeve shaft 154, these members can never rotate relatively to each other. Despite the turn of the disk 132 and the head 70, therefore, the arcuate groove 138 of the disk 132 and that suction hole 140 of the head housing 72 which is connected to the groove 138 can be kept connected to each other.

Referring now to FIG. 6, a power transmission path for the first sleeve shaft 154 will be described.

A bevel gear 184 is mounted on the other end of the first sleeve shaft 154. The gear 184 is in mesh with an output bevel gear 188 of a differential gear system 186. The output gear 188 is mounted on an output shaft of the system 186. The differential gear system, which is generally called a harmonic drive system, is fixedly mounted on the lower drum 28.

The differential gear system 186 includes an input pinion 190 and a toothed input pulley 192 on its input side. The input pinion 190 is in mesh with a ring gear 194, which is fixed, by means of a plurality of fixing bolts 196, to the fixed sleeve 44 which surrounds the drum shaft 32, as mentioned before.

The input pulley 192 is connected to an output pulley (not shown in detail) of a first control motor 200 by means of a toothed belt 198. The motor 200 is also supported by the lower drum 28.

As the lower drum 28 rotates, therefore, the differential gear system 186 can receive an input from the input pinion 190, which is rotated by means of the ring gear 194, and an input from the input pulley 192, which is rotated by means of the first control motor 200.

When the lower drum 28 is first rotated by means of the drive motor 40 with the first control motor 200 off, the differential gear system 186 turns around the drum shaft 32. Accordingly, the input pinion 190 of the system 186 is rotated by means of the fixed ring gear 194. Since the rotatory force of the pinion 190 is transmitted to the first sleeve shaft 154 through the output bevel gear 188 of the differential gear system 186 and the bevel gear 184, the shaft 154 is also rotated. As a result, the work head 70 turns around the first sleeve shaft 154 in association with the rotation of the lower drum 28, while maintaining its posture, as mentioned before.

Figure 10:
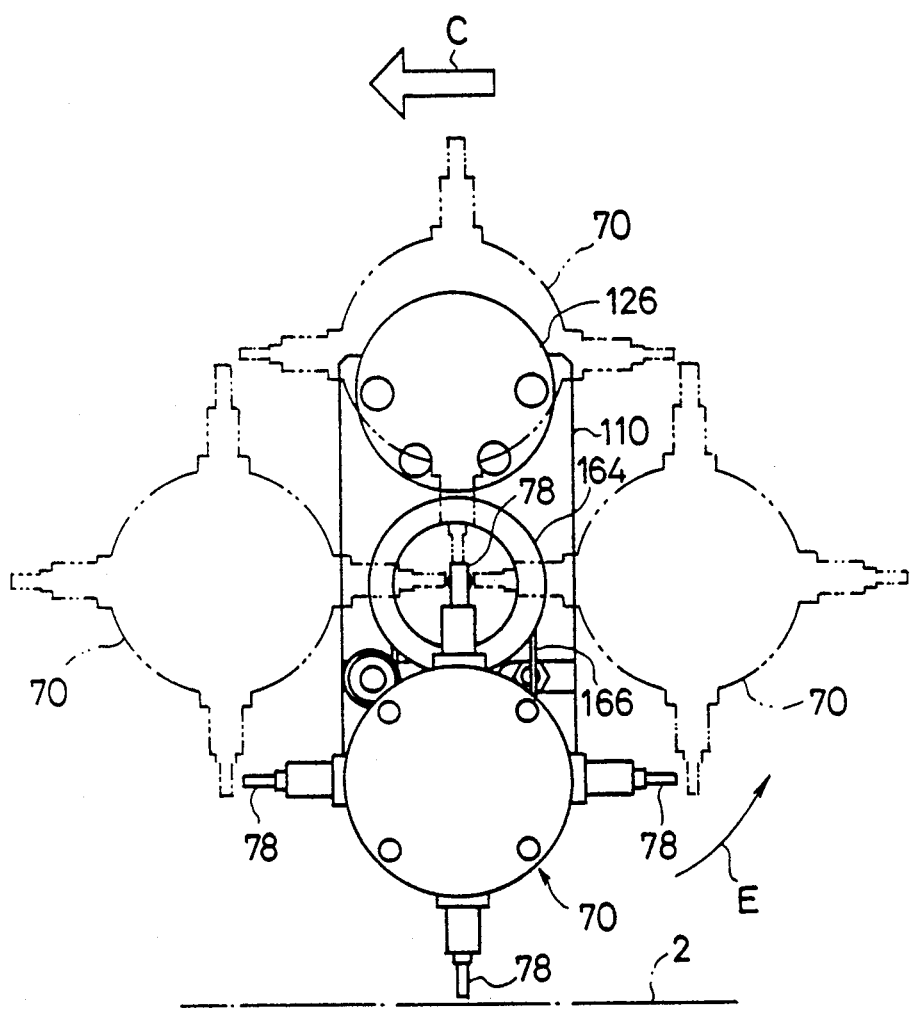
FIG. 10 is a front view showing a work head of the head unit.

The turning direction of the work head 70 is indicated by arrow E in FIG. 10, and the rotating direction of the lower drum 28 by arrow C. When the pivot of the head 70 or the first sleeve shaft 154 moves from right to left of FIG. 10 as the lower drum 28 rotates, the turning direction E of the head 70 is adjusted to the counterclockwise direction. When the work head 70 descends toward the workbench 2, therefore, the head 70 and the workbench 2 move in opposite directions.

If the workbench 2 is situated above the work head 70 as in FIG. 10, the turning direction of the head 70 is opposite to the direction E.

When the first control motor 200 is not driven, the power transmission system including the differential gear system 186 makes the peripheral speed of the lower drum 28 or the speed of revolution of the work head 70 around the drum shaft 32 equal to the turning speed of the head 70 or that of the distal end of each suction nozzle, to be exact.

When the work head 70 is turned, the balance weight 126 also is turned together with the head 70. Thus, the turning motion of the head 70 is stable and smooth, and the turning speed of the head 70 can be controlled with high accuracy.

Figure 11:
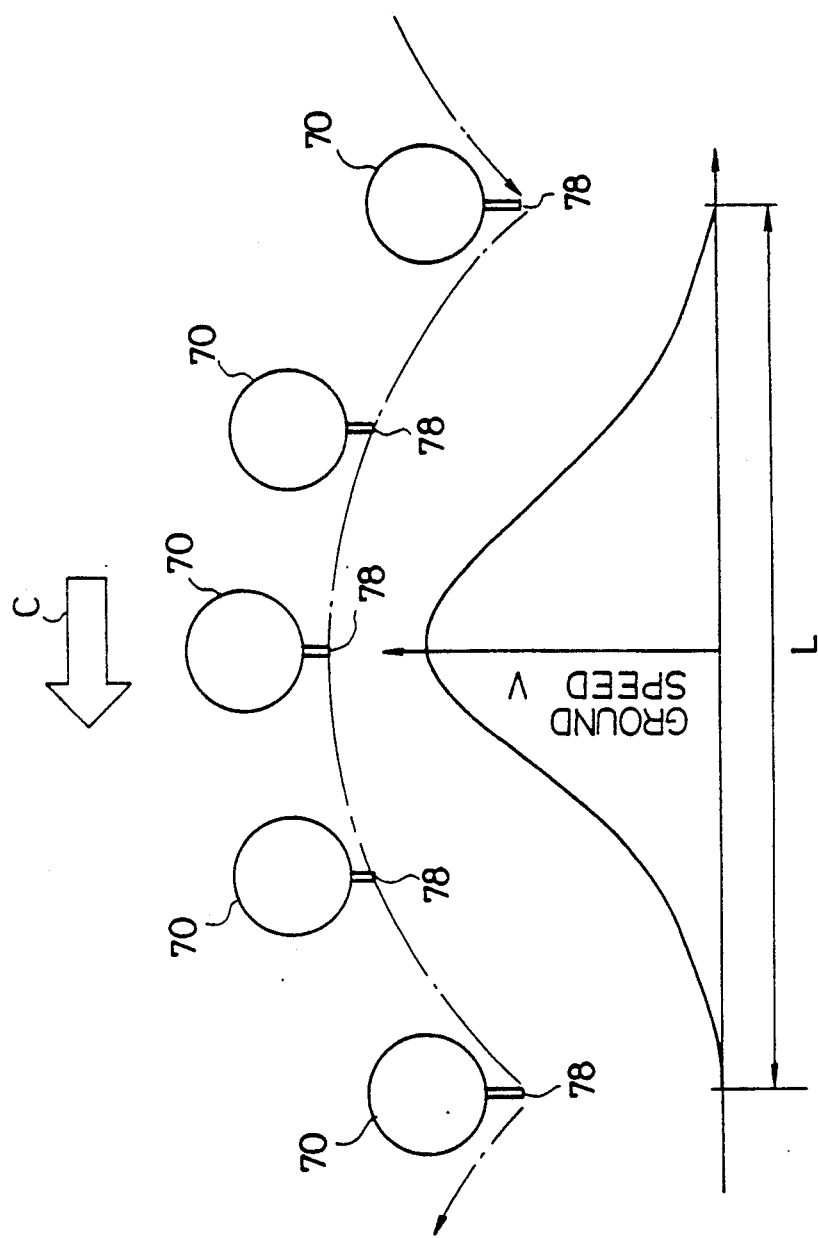
FIG. 11 is a schematic view illustrating the up-and-down motion of a suction nozzle of the work head.

When the rotation of the lower drum 28 and the turning motion of the work head 70 are concurrent, the head 70 repeats a cycloid motion, as shown in FIG. 11. More specifically, the downward suction nozzle 78 of the work head 70 moves so that its distal end generates a cycloid, and repeats up-and-down motion to approach and leave the workbench 2. FIG. 11 also shows change of the speed of movement of the suction nozzle 78 relative to the workbench 2, that is, ground speed V of the nozzle 78. The ground speed V is nearly zero when the suction nozzle 78 is situated in the lower limit position of its up-and-down motion, and is the highest when the nozzle 78 is in its upper motion limit position. The change of the ground speed V indicates the off-state of the first control motor 200.

If the first control motor 200 is driven so that the input pulley 192 of the differential gear system 186 is rotated while the lower drum 28 is rotating, however, the rotating speed of the output shaft or output bevel gear 188 of the system 186, that is, the turning speed of the work head 70, changes. By controlling the drive of the input pulley 192 or the first control motor 200, therefore, the turning speed of the head 70, that is, the cycle L of the cycloid motion of the downward suction nozzle 78, can be varied as required.

The following is a more specific description of the control of the cycloid motion of the work head 70.

Let it be supposed that the up-and-down motion of the head 70 is repeated N number of times if the work head 70 moves along a revolution path, which extends from the work feeder 6 in a position P1 in FIG. 2 to the table face 10 of the XY-table 8, that is, the printed board B, when the drive of the first control motor 200 is stopped. If the turning speed of the work head 70, that is, the cycle L of the cycloid motion thereof, in this state, is varied by the first control motor 200 through the medium of the differential gear system 186, the frequency of the up-and-down motion of the head 70 changes to N±x as the head 70 moves along the revolution path.

This indicates that the downward suction nozzle 78 of the work head 70 can descend to any desired position with respect to the circumferential direction of the workbench 2. Accordingly, the nozzle 78 of the head 70 can access not only any desired work feeder 6 on the workbench 2, but also any position on the revolution path which passes over the printed board B on the XY-table 12.

When the suction nozzle 78 descends toward the work feeder 6 or the printed board B, however, the control of the turning speed of the work head 70 is suspended. When the nozzle 78 reaches its lower motion limit position over the work feeder 6 or the printed board B, therefore, its ground speed V never fails to become zero.

As shown in FIG. 6, a brake unit 202 is arranged on the first sleeve shaft 154. As shown in detail in FIG. 12, the unit 202 comprises a brake drum 204 which is fixed to the first sleeve shaft 154. A brake band 206 is passed around the drum 204. One end of the band 206 is connected, by means of a tension coil spring 210 and an adjust screw 211, to a bracket 208 which is fixed to the lower drum 28. The other end of the band 206 is connected directly to the bracket 208. The spring 210 and the screw 211 have a function to adjust a frictional force between the brake drum 204 and the brake band 206, that is, a braking force against the rotation of the first sleeve shaft 154.

In this arrangement, the brake unit 202 continually applies a fixed torque to the first sleeve shaft 154 in the rotating direction thereof. This torque serves to prevent backlash of engagement between the bevel gear 184 on the side of the shaft 154 and the output bevel gear 188 on the side of the differential gear system 186. Thus, the first sleeve shaft 154 can be prevented from undergoing an undesired rotational angle displacement which is attributable to backlash of engagement. Also, the rotating speed of the shaft 154 or the turning speed of the work head 70 can be controlled with high accuracy.

Figure 12:
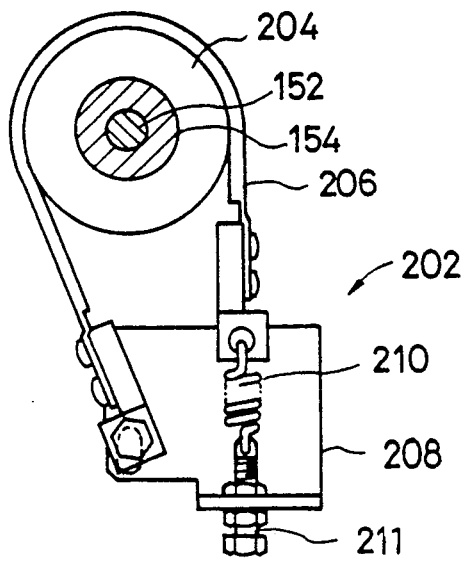
FIG. 12 is a front view of a brake unit.
Figure 13:
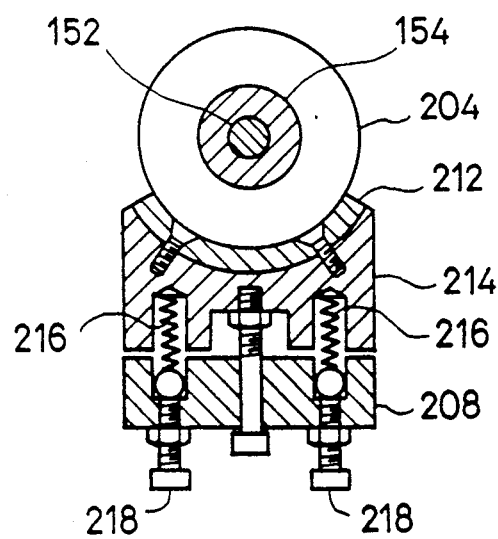
FIG. 13 is a sectional view showing a modification of the brake unit.

The brake unit 202 is not limited to the one shown in FIG. 12, and may be replaced with one shown in FIG. 13. The brake unit of FIG. 13 uses, in place of the brake band 206 of FIG. 12, a press member 214 which includes a brake pad 212. The brake pad 212 of the press member 214 is pressed against the brake drum 204 by means of a pair of compression coil springs 216 which are arranged between the member 214 and the bracket 208. The urging force of each spring 216 can be adjusted by means of adjust screws 218.

As seen again from FIG. 7, toothed input pulleys 220 and 222 are mounted on the respective other ends of the second and third sleeve shafts 156 and 158, respectively. The pulleys 220 and 222 are connected to output pulleys 232 and 234, on the sides of second and third control motors 228 and 230, by means of toothed belts 224 and 226, respectively. As shown in FIG. 6, the motors 228 and 230 are mounted on the lower drum 28 by means of brackets 236, individually.

Thus, when the second and third control motors 228 and 230 are driven, the second and third sleeve shafts 156 and 158 are also rotated by means of their corresponding toothed belts. As mentioned before, the second sleeve shaft 156 and the second spindle 100 of the head unit 68 are connected to each other by means of the pulleys 170 and 106 and the belt 172. When the second sleeve shaft 156 is rotated, therefore, the second spindle 100 is also rotated, so that the work head 70 rotates on its own axis.

Further, the third sleeve shaft 158 and the first spindle 92 of the head unit 68 are connected by means of the pulleys 176 and 98 and the belt 178. When the third sleeve shaft 158 is rotated, therefore, the first spindle 92 is rotated, so that each suction nozzle 78, along with its corresponding nozzle holder 76, rotates around its axis, as mentioned before.

The suction circuit shown in FIG. 6 is one used for one of the head units 68. The following is a description of this suction circuit.

The suction circuit comprises a vacuum pump 238. A connecting line 240 extends from the pump 238, and is connected to a radial hole 242 in the fixed sleeve 44 by means of a connector 242.

An annular groove 246 is formed on the outer peripheral surface of the drum shaft 32 in the fixing sleeve 44, so that it communicates with the radial hole 242 at all times. The groove 246 is connected to an internal passage 248 of the drum shaft 32, which axially extends in the shaft 32 to the upper end thereof. The upper end of the passage 248 is closed by means of a plug. The upper end portion of the passage 248 is connected to a connecting line 252 by means of a connector 250. The line 252, which extends toward the head unit 68, is connected to one port 256 of a control valve 254.

In the case of this embodiment, moreover, the suction circuit is provided with a pneumatic pressure source 258, which is connected to a radial hole 264 in the fixed sleeve 44 by means of a connecting line 260 and a connector 262.

An annular groove 266, which communicates with the radial hole 264 at all times, is formed on the outer peripheral surface of the drum shaft 32. The groove 266 is connected to an internal passage 268 of the shaft 232. The passage 268, like the aforesaid internal passage 248, extends to the upper end of the drum shaft 32, and its upper end is closed by means of a plug. The upper end portion of the passage 268 is connected to a connecting line 272 by means of a connector 270. The line 272, which extends toward the head unit 68, is connected to one input port 276 of a selector valve 274.

A line 278, which diverges from the middle of the connecting line 272, is connected to another input port 280 of the selector valve 274. A pressure regulating valve 282 is provided in the middle of the line 278.

An output port 284 of the selector valve 274 is connected to another port 288 of the control valve 254 by means of a connecting line 286.

Further, the control valve 254 is provided with still another port 290, besides the ports 256 and 288. The port 290 is connected to the connecting plug 144 of the head unit 68 by means of the tube 146.

The control valve 254 and the selector valve 274 are formed of a solenoid-operated directional control valve of a three-port two-position type (not shown in detail) each. Thus, when the control valve 254 is in one shift position or suction position the port 290 of the valve 254 is connected to the first port 256. When the control valve 254 is shifted from the suction position to the other shift position or blow position, the port 290 is connected to the second port 288.

When the selector valve 274 is in one shift position or high-pressure position, the output port 284 of the valve 274 is connected to the one input port 276. When the valve 274 is shifted from the high-pressure position to the other shift position or low-pressure position, the output port 284 is connected to the other input port 280.

The pressure regulating valve 282 reduces a blow pressure supplied from the pneumatic pressure source 258 to a predetermined pressure level, and supplies it to the input port 280 of the selector valve 274.

The control valve 254, selector valve 274, and pressure regulating valve 282 are all fixedly arranged on the lower drum 28.

The connecting lines 240 and 260, which extend from the vacuum pump 238 and the pneumatic pressure source 258, respectively, are always connected to their corresponding connecting lines 252 and 272 through the internal passages 248 and 368 of the drum shaft 32, respectively, without regard to the rotation of the shaft 32.

Thus, when the control valve 254 is in the suction position, the tube 146 or the downward suction nozzle 78 of the work head 70 is connected to the connecting line 252 through the valve 254, and can be supplied with the suction pressure from the line 252. When the control valve 254 is shifted to the blow position, the suction nozzle 78 of the work head 70 is connected to the connecting line 272 through the valve 254, connecting line 286, and selector valve 274, and can be supplied with the blow pressure from the line 272. The blow pressure supplied to the nozzle 78 can be varied in two stages by changing the shift position of the selector valve 274.

An identification camera 292 is provided at one end of the workbench 2. As shown in FIG. 2, the camera 2 is located on the upper-course side of the XY-table 8 with respect to the rotating direction C of the lower drum 28. The camera 292, which is situated just below the surface level of the workbench 2, faces upward. Thus, when the work head 70 of the head unit 68 passes over the identification camera 292 as the lower drum 28 rotates, the camera 292 photographs the work attached to the downward suction nozzle 78 of the head 70. In this case, the nozzle 78 of the head 70 must be situated on its lowest level when it reaches the position nearest to the camera 292, that is, the position corresponding to the camera 292.

Thus, while the work head 70 is in turning motion as it revolves around the drum shaft 32, the downward suction nozzle 78 of the head 70 is situated on the lowest level when it reaches the position corresponding to the identification camera 292 and then a predetermined position or work mounting position P2 (see FIG. 2) on the printed board B on the XY-table 8. While the work head 70 moves from the location of the camera 292 to the mounting position P2, it makes an integral number of turns.

When the work head 70 moves from the location of the camera 292 to the mounting position P2, on the other hand, the toothed belt 172, which connects the output pulley 170 and the head driving pulley 106 of the head unit 68, travels for a distance equal to an integral multiple of its overall length. Thus, the state of engagement of the belt 172 with the pulleys 170 and 106 established when the location of the camera 292 is reached by the downward suction nozzle 78 of the work head 70 never fails to be reproduced when the mounting position P2 is reached by the nozzle 78.

As shown in FIG. 2, moreover, a work recovery container is arranged at the other end of the workbench 2 so as to be situated on the lower-course side of the XY-table 8 with respect to the rotating direction C of the lower drum 28. Only an opening 294 of the recovery container is shown in FIG. 2.

The first to third control motors 200, 228 and 230, the control valve 254 and the selector valve 274 of the suction circuit, the identification camera 292, rotary encoders designated by numeral 296 in FIG. 6, etc. are connected electrically to the controller 69 (see FIG. 3), which is housed in the upper drum 26. The controller 69 is also connected electrically to a computer (not shown). In this arrangement, the controller 69 receives an image signal from the camera 292, rotational angle signals from the rotary encoders 296, and a control signal from the computer, and controls the control motors 200, 228 and 230 and the valves 254 and 274 in accordance with these signals.

Referring additionally to FIGS. 14 to 18, the operation of the aforementioned chip mounter will now be described. In these drawings, subscripts a, b, c and d are affixed to reference numeral 78 which designates each, suction nozzle of the work head 70. If the subscripts are thus affixed to numeral 78, it becomes evident that the posture of each nozzle 78 with respect to the workbench 2 makes no change even though the work head 70 is in turning motion.

Figure 14:
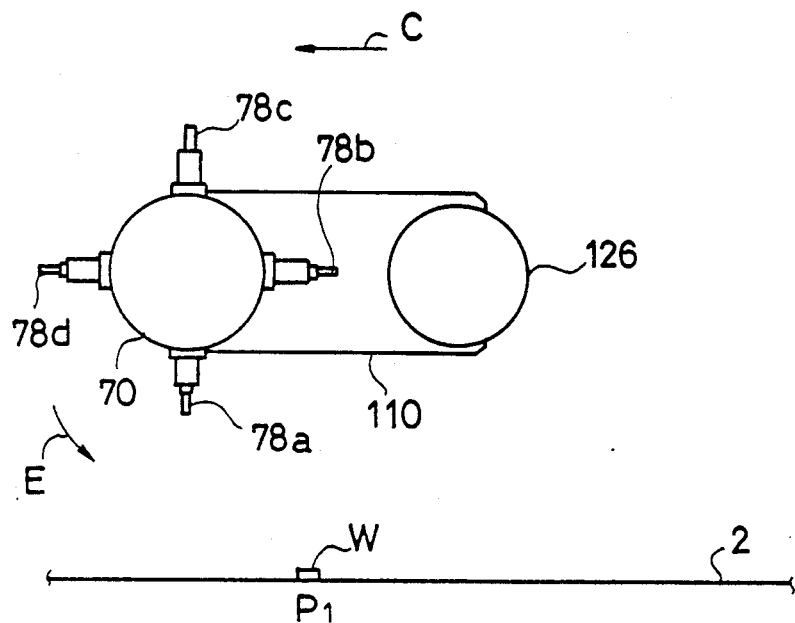
FIG. 14 is a front view showing the work head immediately before a work is attracted to a suction nozzle.

FIG. 14 shows a state in which the work head 70 is situated right over the work feeder 6 in the position P1 of FIG. 2 during the rotation of the lower drum 28. At this time, the work head 70 is turning toward the workbench 2, as indicated by arrow E, and the turning speed of the head 70 is equal to the peripheral speed of the lower drum 28, that is, the speed of revolution of the head itself.

In the state shown in FIG. 14, the controller 69 in the upper drum 26 shifts the control valve 274 of the suction circuit to the suction position, so that the suction pressure from the vacuum pump 238 is supplied to the downward suction nozzle 78a of the work head 70.

Figure 15:
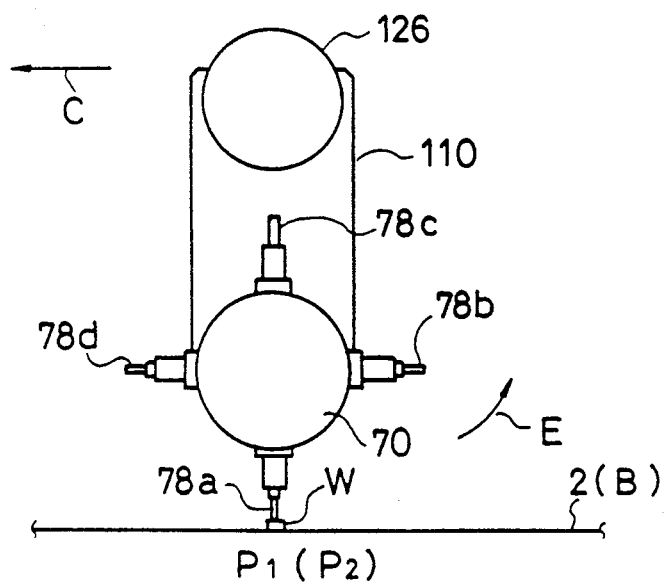
FIG. 15 is a front view showing the work head at the point of time when the work is attracted to the suction nozzle.

When the rotation of the lower drum 28 advances from the state of FIG. 14, thereafter, the suction nozzle 78a of the work head 70 further descends toward the position P1 on the workbench 2, and reaches the position of FIG. 15. In this state, the nozzle 78a of the head 70 is situated on the lowest level in the position P1. At this time, the speed of the nozzle 78a with respect to the workbench 2, that is, the ground speed V, becomes substantially zero, as mentioned before, so that the nozzle 78a can securely attract thereto, by its suction pressure, the work W fed to the position P1 by the work feeder 6.

Figure 16:
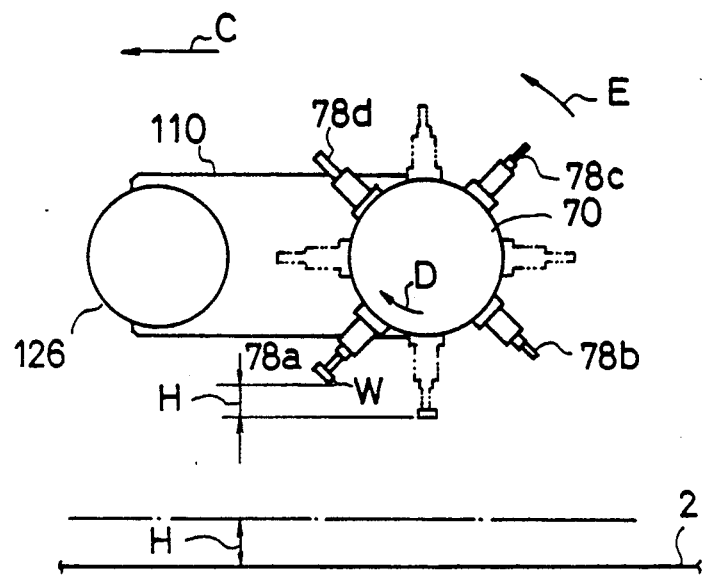
FIG. 16 is a front view showing the work head after the work is attracted to the suction nozzle.

When the rotation of the lower drum 28 and the turning motion of the work head 70 further advance, thereafter, the suction nozzle 78a turns in the direction to go away from the workbench 2 without leaving hold of the work W. At this time, the controller 69 executes drive control of the second control motor 228, that is, drives the motor 228. The driving force of the second control motor 228 is transmitted to the work head 70 through the toothed belt 224, input pulley 220, second sleeve shaft 156, output pulley 170, toothed belt 172, head driving pulley 106, and second spindle 100, and the head 70 rotates on its own axis for the aforesaid rotational angle α in the direction of arrow D, as shown in FIG. 16. As a result, the work head 70 assumes the rotational posture shown in FIG. 16.

Even though the work head 70 rotates on its own axis, the control hole 142 of the control disk 132 and one of the suction holes 140 of the work head 70 are kept connected to each other by means of the arcuate groove 138, as shown in FIG. 9. Thus, the supply of the suction pressure to the suction nozzle 78a is continued, and the nozzle 78a keeps on holding the work W.

When the work head 70 rotates on its own axis in the aforesaid manner, the lower end of the suction nozzle 78a is raised by a height H, as shown in FIG. 16. After this, therefore, the nozzle 78a of the head 70 repeats its up-and-down motion within the region above the workbench 2 for the height H, at the least. Thus, when the work head 70 then passes over its adjoining work feeder 6, there is no possibility of the suction nozzle 78a interfering with the other work feeders on the workbench 2 or other mechanical members.

Figure 17:
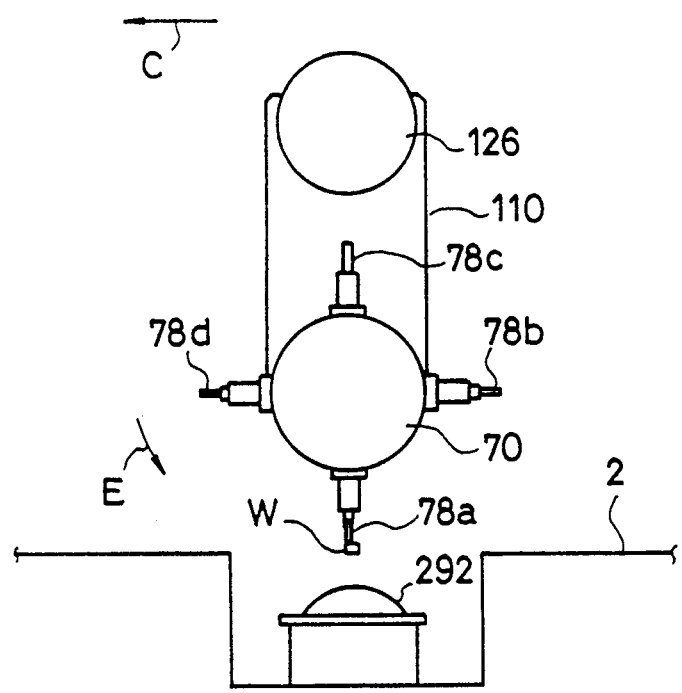
FIG. 17 is a front view showing the work head with the suction nozzle right over an identification camera.

When the rotation of the lower drum 28 further advances so that the work head 70 reaches the position just short of the identification camera 292, thereafter, the controller 69 drives the second control motor 228 to restore the head 70 to its original posture, whereupon the suction nozzle 78a of the head 70 faces downward again. Thus, when the nozzle 78a reaches its lowest position right over the camera 292, as shown in FIG. 17, the work W attached to the nozzle 78a faces the camera 292, whereupon the camera 292 photographs the work W. In this manner, the posture of the work W on the suction nozzle 78a can be clearly identified by means of the identification camera 292.

Image data on the work W, obtained by means of the identification camera 292, is supplied to the controller 69. Based on this image data, the controller 69 determines whether or not the work W is held in a right posture or orientation on the suction nozzle 78.

Figure 18:
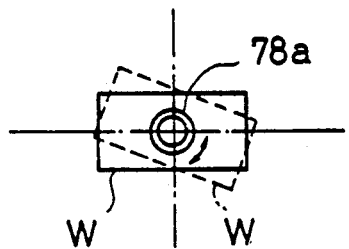
FIG. 18 is a view showing the posture of the work attracted to the suction nozzle.

More specifically, the controller 69 determines whether or not the posture of the work W is deviated from vertical and horizontal reference lines shown in FIG. 18. If the posture of the work W is deviated beyond the reference lines the tolerance limits, as indicated by broken line in FIG. 18, the controller 69 drives the third control motor 230, depending on the degree and direction of the deviation of the work posture. The driving force of the third control motor 230 is transmitted to the first spindle 92 through the toothed belt 266, input pulley 222, third sleeve shaft 158, output pulley 176, toothed belt 178, and nozzle driving pulley 98, and causes the spindle 92 to rotate. Since the rotatory force of the first spindle 92 is transmitted to the suction nozzle 78a through the side gear 94, pinion 96, and nozzle holder 76, the nozzle 78a is also rotated around its axis. Thereupon, the posture of the work W is corrected, as indicated by full line in FIG. 18.

As the lower drum 28 rotates, thereafter, the work head 70 moves toward the printed board B on the XY-table 8 while repeating the turning motion. When the suction nozzle 78a of the head 70 reaches the mounting position P2 on the printed board B, it is situated on the lowest level as in the case for the position P1. Accordingly, this state is identical with the one shown in FIG. 15, and the speed of the suction nozzle 78a relative to the printed board B is substantially zero.

The controller 69 executes shift control for the control valve 274 at a proper point of time immediately before the suction nozzle 78a reaches the mounting position P2. Thus, the control valve 274 is shifted from the suction position to the blow position. When the nozzle 78a reaches the mounting position P2, therefore, it releases its hold of the work W, and at the same time, securely mounts the work W in the mounting position P2 on the printed board B, with the aid of the blow pressure supplied from the pneumatic pressure source 258.

The state of engagement between the toothed pulleys 172 and 178 and their corresponding pulleys on the sides of the first sleeve shaft 154 and the work head 70 established when the work W is photographed by the identification camera 292 is identical with that between the same components established when the work W is mounted on the printed board B, as mentioned before. At these points of time, therefore, the work head 70 assumes the same turning posture, and also the suction nozzle 78a assumes the same turning and rotational position.

Thus, even if the posture of the attracted work W is corrected based on the image data of the work W obtained when the work W is photographed, the posture correction never entails a deviation attributable to factors such as a pitch error or cumulative pitch error of the teeth of the pulleys 172 and 178 and a displacement of the outer peripheries of the pulleys, when the work W is mounted thereafter. Accordingly, at the time of mounting the work W, the posture of the corrected work W can be accurately maintained, thus permitting high-accuracy mounting of the work W.

While the work W is mounted in this manner, the selector valve 274 is shifted to the low-pressure position by means of the controller 69, so that a low blow pressure is utilized for the work mounting.

Before the work W is mounted, the printed board B on the XY-table 8 is shifted in the X-direction and/or Y-direction in FIG. 2, and the mounting position P2 is previously set as the position for the work W on the board B.

If the posture of the work W is uncorrectable, the mounting operation for the work W is suspended. Thus, the suction nozzle 78a passes over the printed board B with the work W held thereon. Immediately before the nozzle 78a reaches the position over the opening 294 of the recovery container, thereafter, the controller 69 executes shift control for the control valve 254 and the selector valve 274. More specifically, at this point of time, the control valve 254 is shifted from the suction position to the blow position, while the selector valve 274 is shifted from the low-pressure position to the high-pressure position. Thus, the work W on the suction nozzle 78a is blown away toward the recovery container by means of a high blow pressure.

Thereafter, the work head 70 is changed to the posture shown in FIG. 16, and moved toward the target work feeder 6. Immediately before reaching this work feeder 6, the head 70 is restored to the posture shown in FIG. 14, and repeats the aforesaid operation.

When the controller 69 is supplied with a command for the change of the suction nozzle 78, it drives the second control motor 228. The driving force of the motor 228 is transmitted to the work head 70 through the toothed belt 224, input pulley 220, second sleeve shaft 156, output pulley 170, toothed belt 172, head driving pulley 106, and second spindle 100, and the head 70 is caused to rotate on its own axis to the rotational angle position where the selected suction nozzle faces downward. In this case, therefore, the selected nozzle, like the aforesaid suction nozzle 78a, is connected to the control valve 254 by means of the arcuate groove 138 and the control hole 142 of the control disk 132.

According to the chip mounter described above, the works can be continuously mounted on the printed board B by means of the suction nozzles 78 of each work head 70, without stopping the rotation of the lower drum 28.

Since the suction nozzles 78 of each work head 70 can receive the works on the work feeders 6 on any position on the workbench 2, and mount the works on any position on the printed board B, the mounting efficiency of the works can be greatly improved.

It is to be understood that the present invention is not limited to the embodiment described above, and that various changes and modifications may be effected therein by one skilled in the art without departing from the scope or spirit of the invention.

Figure 19:
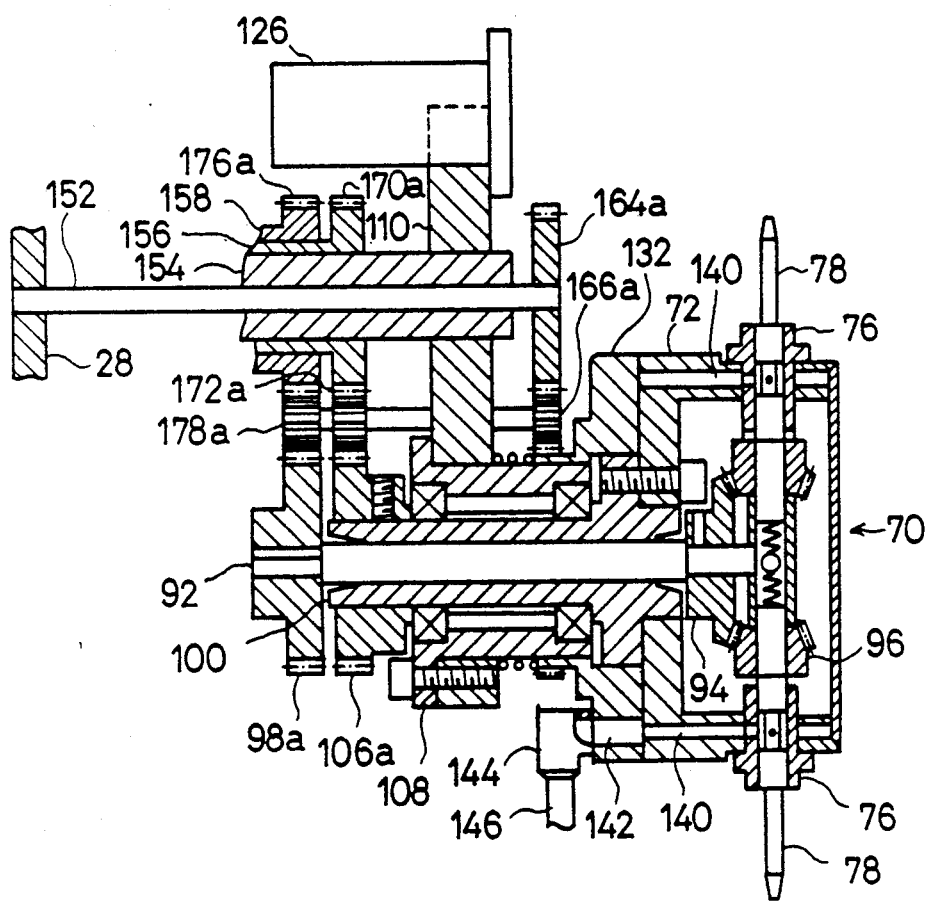
FIG. 19 is a sectional view showing a modification of the head unit.

Referring to FIG. 19, for example, there is shown a modification of the head unit. The head unit of this modification comprises input and output gears, used in place of the aforementioned input and output pulleys, and intermediate gears which replace the toothed belts. Since these input and output gears and intermediate gears have the same functions as their corresponding input and output pulleys and toothed belts, a description of those gears is omitted. In FIG. 19, the input and output gears and intermediate gears are designated by reference numerals obtained by affixing a subscript a to the numerals which are used to designate their corresponding input and output pulleys and toothed belts.

Also in the case of this modification, the state of engagement between the intermediate gears 172a and 178a and their associated input and output gears can be reproduced, as in the foregoing embodiment.

Figure 20:
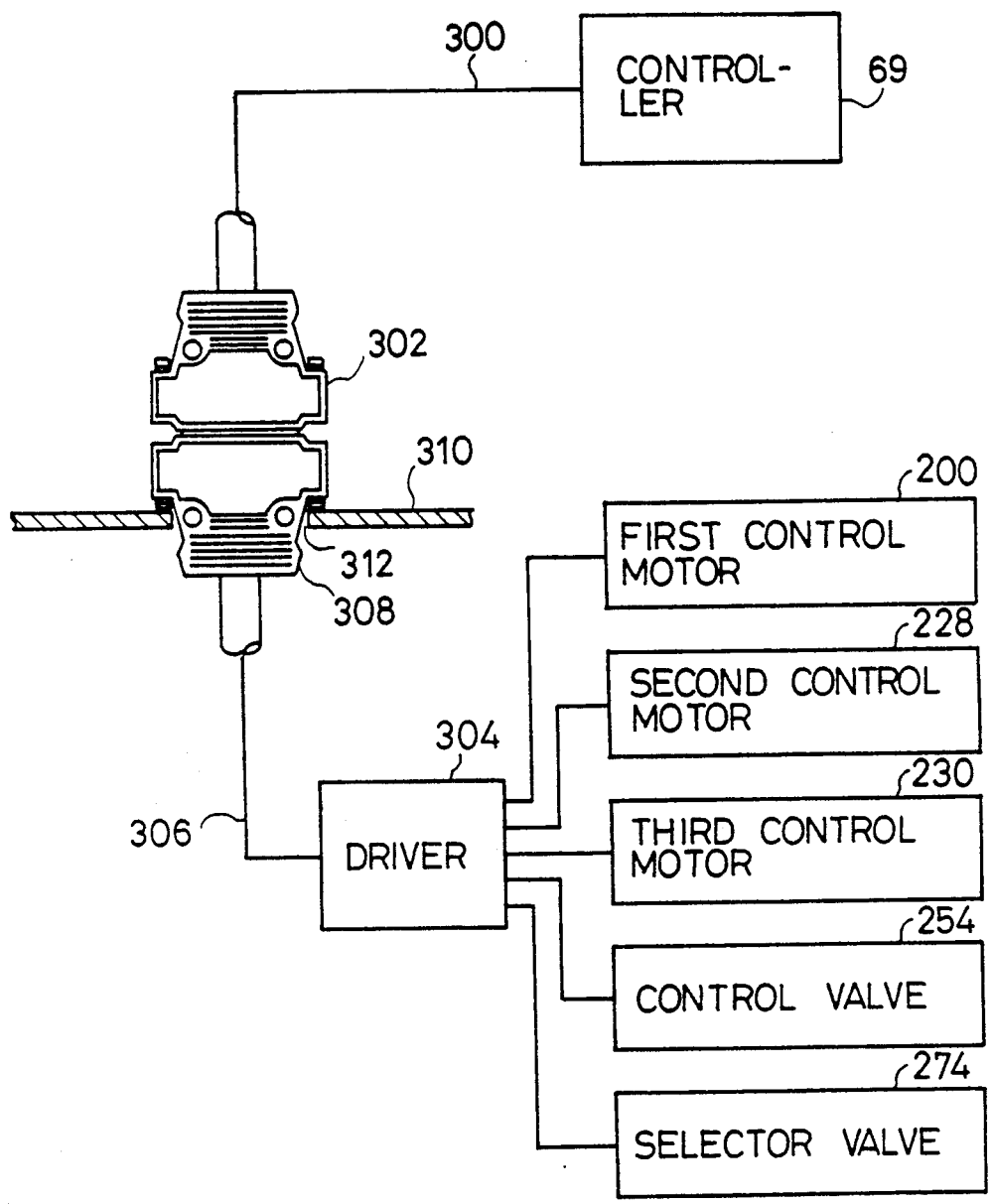
FIG. 20 is a view showing connectors for electrically connecting a controller on the upper-drum side and various devices on the lower-drum side.
Figure 21:
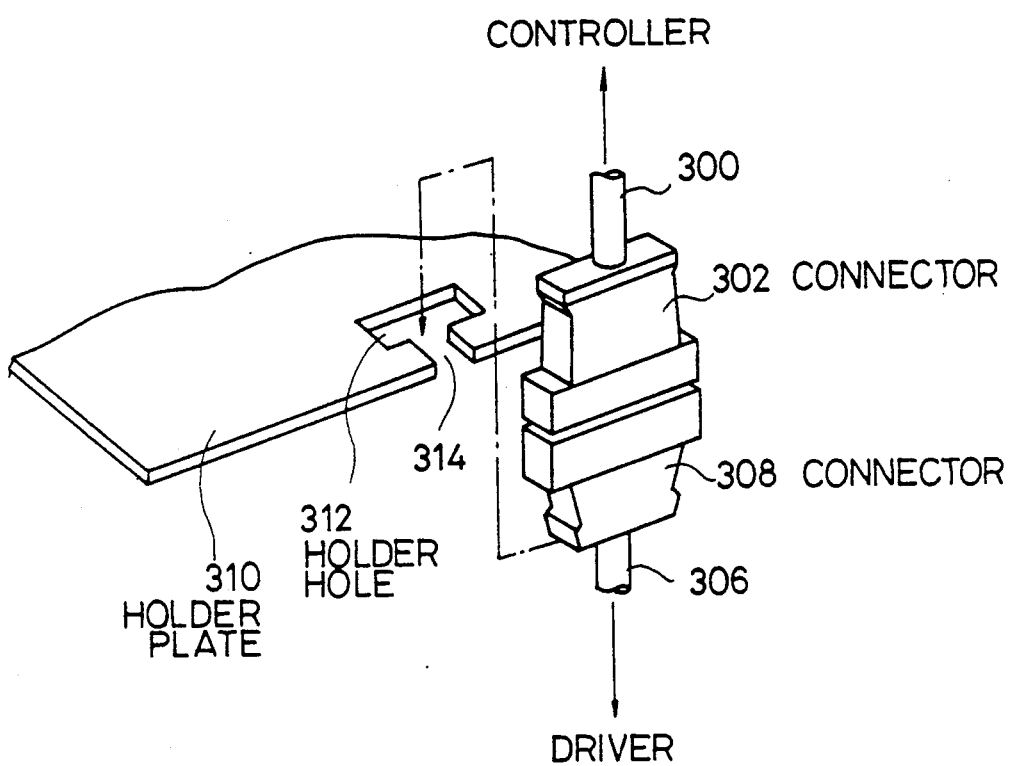
FIG. 21 is a perspective view illustrating the way of mounting the connectors.

In the foregoing embodiment, the first to third control motors 200, 228 and 230, control valve 254, and selector valve 274 on the side of the lower drum 28 have been described as being connected only electrically to the controller 69 in the upper drum 26. Specifically, a connector unit shown in FIGS. 20 and 21 is used for the connection between these elements.

The connector unit comprises mating connectors 302 and 308, which have the same configuration. The one connector 302 is connected to the controller 69 by means of a cable 300. A cable 306, which extends from the other connector 308, is connected to the first to third control motors 200, 228 and 230, control valve 254, and selector valve 274 through a driver 304. The moment the mating connectors 302 and 308 are connected to each other, therefore, the electrical connection between the upper and lower drums 26 and 28 is established. Each of the connectors 302 and 308 has a stepped configuration, including a smaller end portion on its cable side.

The connector unit further comprises a holder plate 310 for the connectors 302 and 308. The plate 310 is horizontally fixed to the lower drum 28 (not shown in detail). A holder hole 312 is formed in the holder plate 310. The hole 312 is situated near an outer side edge of the plate 310, and has a size great enough to receive the smaller end portion of the connector 308. A notch 314 continuous with the holder hole 312 is formed in the aforesaid outer side edge of the holder plate 310.

According to the connector unit described above, the connectors 302 and 308 can be easily attached to the holder hole 312 of the holder plate 310 even though they are connected to each other. In attaching these connectors, the cable 306 of the connector 308 is first guided through the notch 314 into the holder hole 312, and the smaller end portion of the connector 308 is then inserted into the hole 312 from above. Thereupon, attaching the connectors 302 and 308 to the holder plate 310 is completed.

As described above, the connectors 302 and 308 can be securely held in position by only being inserted into the holder hole 312. During the operation of the chip mounter, the holder plate 310 is rotated together with the lower drum 28 at constant speed, so that the connectors 302 and 308 are pressed against the edge of the holder hole 312 by centrifugal force. Thus, no play can be caused between the connectors and the holder plate 310.

Meanwhile, the connectors 302 and 308 can be easily removed from the holder plate 310 by only being drawn out from the holder hole 310.

Further, the connectors 302 and 308 may be attached by using the brackets 236 (see FIG. 6) for the control motors in place of the holder plate 310. Preferably, however, the plate 310 should be located in a position near the outer peripheral portion of the lower drum 28 such that the connectors 302 and 308 are easily accessible from the outside.

Figure 22:
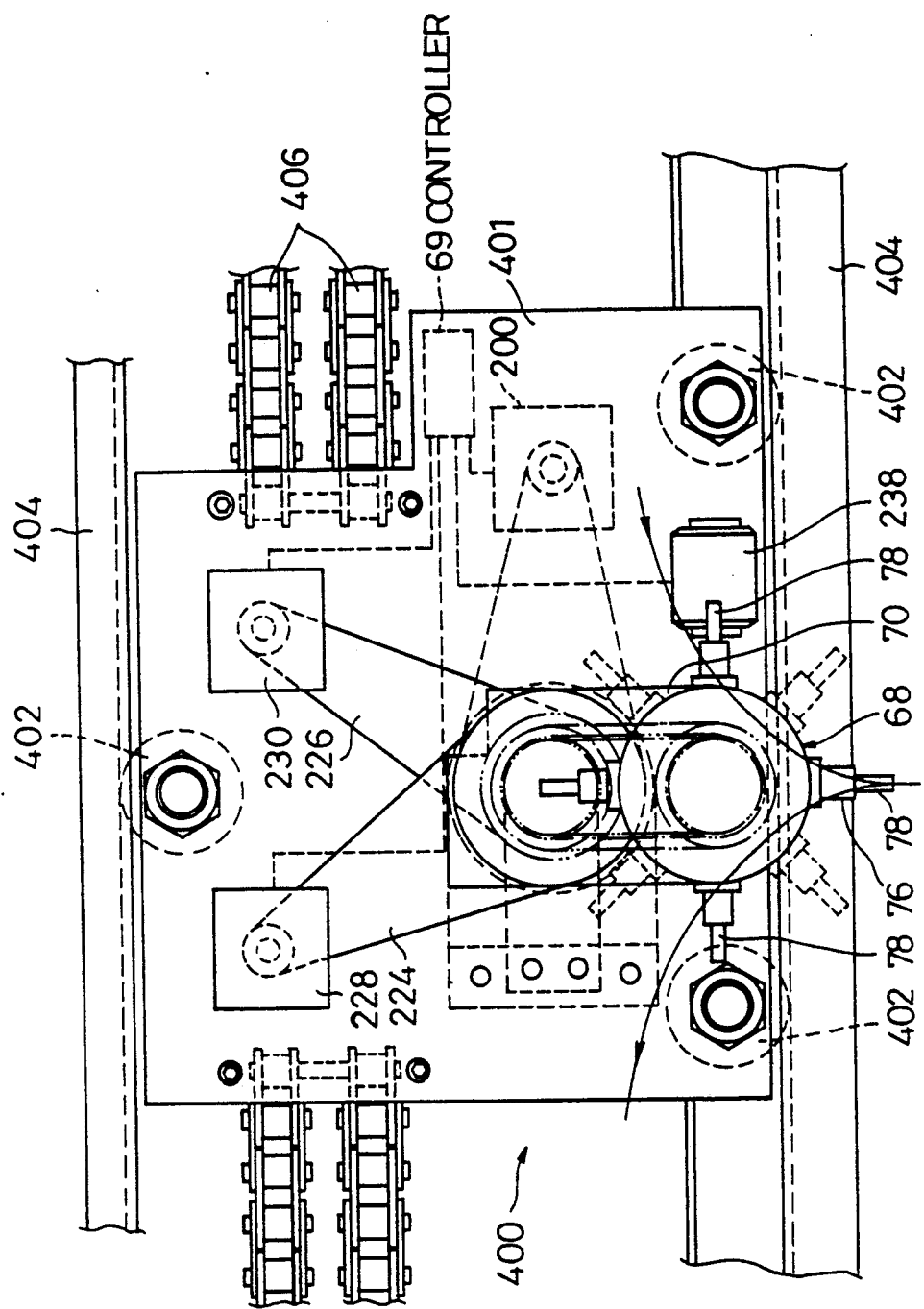
FIG. 22 is a front view showing part of another clip mounter.
Figure 23:
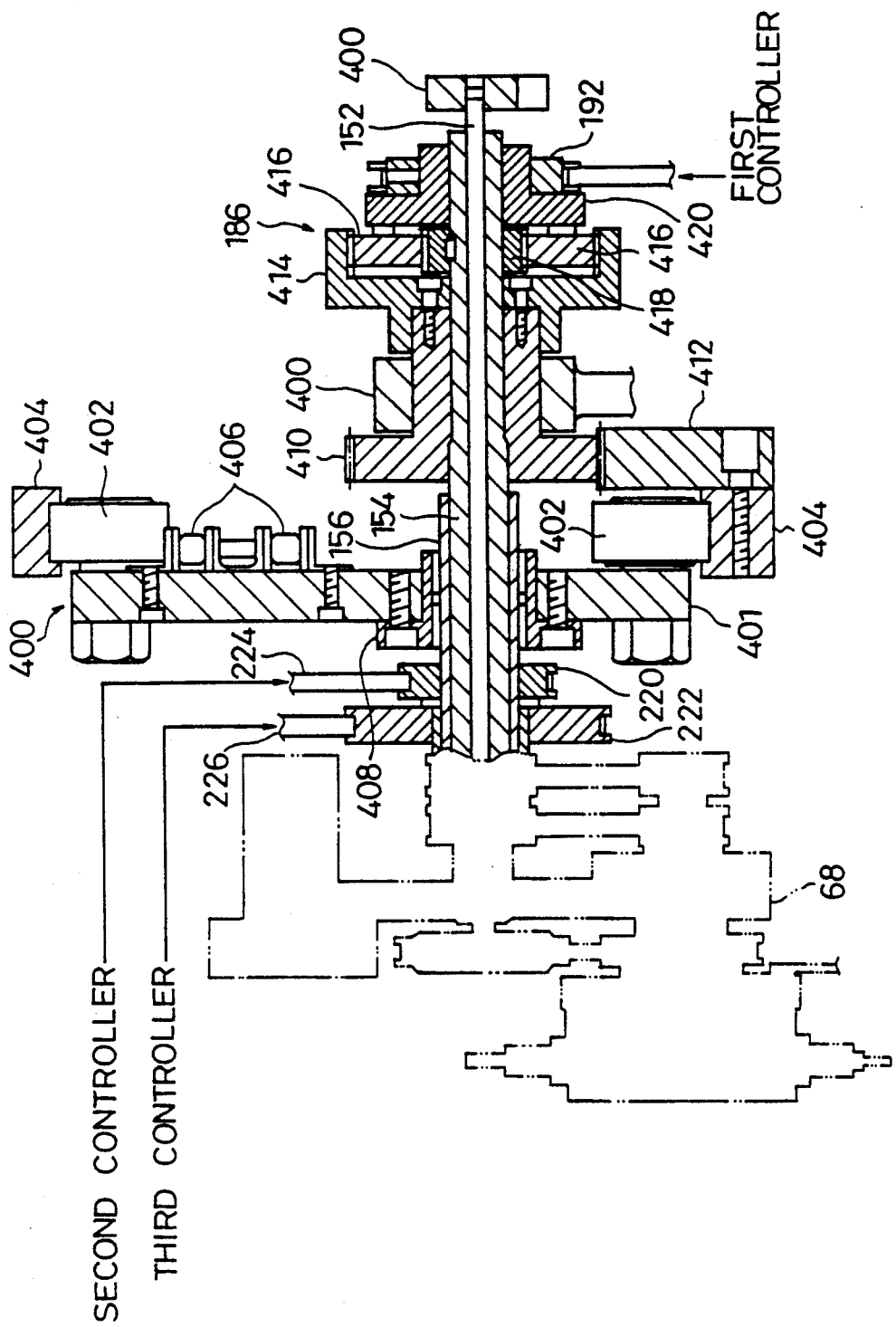
FIG. 23 is a sectional view showing part of the clip mounter of FIG. 22.

Referring now to FIGS. 22 and 23, there is shown another chip mounter. This chip mounter comprises a plurality of carriers 400 in place of the lower drum 28. Each carrier 400 includes a carrier plate 401. One roller 402 is rotatably mounted on the central portion of the upper edge of the carrier plate 401, while a pair of spaced rollers 402 are rotatably mounted on the lower edge of the plate 401.

A pair of guide rails 404 are arranged above and below the carrier plate 401, individually, so that the carrier 400 can be run on the rails 404 by means of the rollers 402.

Chain conveyors 406 are connected to the carrier plate 401. The conveyors 406 and the guide rails 404 extend along a fixed transportation path, which may be an endless one or one having two opposite ends. Thus, when the chain conveyors 406 are run, the carrier 400 is transported together with the conveyors 406 along the guide rails 404 at constant speed.

the head unit 68 is supported on the carrier plate 401. More specifically, the first and second sleeve shafts 154 and 156 of the unit 68 extend through a bearing 408 and penetrate the plate 401.

In the case of this embodiment, the other end of the fixed shaft 152 is supported by the carrier 100, and the differential gear system 186 is provided on the first sleeve shaft 154. The system 186 includes an output pinion 410 in place of the output bevel gear 188. The pinion 410, which is mounted on the first sleeve shaft 154, is in mesh with a rack 412, which extends along the lower guide rail 404. The rack 412 is a member which corresponds to the ring gear 194.

Further, the output pinion 410 is attached to a ring gear 414 of the differential gear system 186. The gear 414 is in mesh with a plurality of planet gears 416, which are in mesh with a sun gear 418. The sun gear 418 is mounted on the first sleeve shaft 154. The input pulley 192 of the differential gear system 186 is mounted on a holder 420 for the planet gears 416.

A workbench (not shown) for work feeders is located under the head unit 68. The workbench extends along the guide rails 404, and the XY-table 8 is disposed in the middle of the workbench.

In the case of the chip mounter described above, the first sleeve shaft 154 rotates when the carrier 400 is moved along the guide rails 404, since the output pinion 410 of the differential gear system 186 is in mesh with the rack 412. Thus, as in the case of the foregoing embodiment, the work head 70 turns around the first sleeve shaft 154 without changing its posture, so that the downward suction nozzle 78 of the head 70 repeats cycloid motion along the guide rails 412. It is to be understood that the cycle of the cycloid motion can be varied by rotating the input pulley 192 of the differential gear system 186.

Also in the case of the chip mounter shown in FIGS. 22 and 23, therefore, the suction nozzle 78 of the work head 70 can attract a work to it from any desired work feeder on the workbench, and then mount the attracted work on a printed board on the XY-table.

What is claimed is:

1. A work mounting apparatus comprising:
   a work supply section disposed in a predetermined transportation path and having a supply position which is successively supplied with works;
   a work mounting section disposed at a distance from the supply section, in the transportation path, and having a work mounting surface on which the works are to be mounted by the work mounting apparatus;
   a carrier repeatedly movable along the transportation path between the mounting section and the supply section, said carrier including a first shaft having a first axis which extends across the transportation path;
   a work head provided on the carrier, said work head having a second axis is substantially parallel to said first axis and including an attraction rod projecting from the work head toward the transportation path, said attraction rod having a distal end;
   turning means for turning the work head around the first axis in a circular translational manner so as to maintain the work head in a fixed orientation with respect to the transportation path, during the movement of the carrier, and moving the distal end of the attraction rod in a cycloid motion along the transportation path;
   attraction means for supplying an attraction force to the rod;
   control means for controlling the turning means and the attraction means so as to attract one of the works to the distal end of the rod in the supply position, and then release the attracted work from the distal end of the rod at the mounting surface, so that the work is mounted on the mounting surface; and
   stabilizing means for stabilizing the turning motion of the work head.

2. The work mounting apparatus according to claim 1, wherein said stabiliing means includes a balance weight which is turned around the first axis together with the work head.

3. The work mounting apparatus according to claim 2, wherein said turning means includes a link arm having a central portion thereof connected to the first shaft, the work head being mounted to one end of the link arm, and the balance weight being mounted to another end of the link arm.

4. The work mounting apparatus according to claim 1, wherein said turning means includes a gear mounted on the first shaft and receiving a driving force, and the stabilizing means includes a friction brake for applying a friction force to the first shaft.

5. The work mounting apparatus according to claim 4, wherein said friction brake includes a friction disk mounted on the first shaft, a brake band passed around the friction disk, and means for applying a constant tension to the brake band.

6. The work mounting apparatus according to claim 4, wherein said friction brake includes a friction disk mounted on the first shaft, a brake pad pressed against the friction disk, and means for adjusting the force with which the brake pad is pressed against the friction disk.

7. The work mounting apparatus according to claim 1, wherein said turning means includes an engagement-type planetary mechanism for maintaining the work head in a fixed orientation during the turning motion of the work head, and said stabilizing means includes means for repeatedly reproducing an identical state of engagement in the planetary mechanism while the turning motion of the work head is repeated, said work mounting apparatus further including detecting means for detecting an orientation of the work attracted to the rod, and correcting means for correcting the orientation of the attracted work in accordance with a result of detection provided by the detecting means, a state of engagement in the planetary mechanism being established when the orientation of the work detected by the detecting means is identical with that established when the work is mounted on the mounting surface.

8. The work mounting apparatus according to claim 7, wherein said planetary mechanism includes a sleeve shaft coaxially surrounding the first shaft, a toothed pulley mounted on the sleeve shaft, a toothed pulley coaxially connected to the work head, and a toothed belt passed around and between these pulleys.

9. The work mounting apparatus according to claim 8, wherein said detecting means includes a camera for photographing the orientation of the work attracted to the rod.

10. The work mounting apparatus according to claim 9, wherein said correcting means includes means for rotating the rod on its own axis.

* * * * *